United States Patent
Lu et al.

(10) Patent No.: US 10,629,272 B1
(45) Date of Patent: Apr. 21, 2020

(54) TWO-STAGE RAMP UP OF WORD LINE VOLTAGES IN MEMORY DEVICE TO SUPPRESS READ DISTURB

(71) Applicant: SanDisk Technologies LLC, Addison, TX (US)

(72) Inventors: Ching-Huang Lu, Fremont, CA (US); Hong-Yan Chen, San Jose, CA (US); Wei Zhao, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/274,153

(22) Filed: Feb. 12, 2019

(51) Int. Cl.
G11C 16/04 (2006.01)
G11C 16/34 (2006.01)
G11C 7/04 (2006.01)
G11C 16/08 (2006.01)
G11C 16/28 (2006.01)

(52) U.S. Cl.
CPC ............ G11C 16/3427 (2013.01); G11C 7/04 (2013.01); G11C 16/08 (2013.01); G11C 16/28 (2013.01)

(58) Field of Classification Search
CPC ..... G11C 16/3427; G11C 16/08; G11C 16/28; G11C 7/04
See application file for complete search history.

(56) References Cited

U.S. PATENT DOCUMENTS

| | | | |
|---|---|---|---|
| 7,061,803 B2* | 6/2006 | Kim | G11C 8/08 365/185.17 |
| 8,891,304 B2* | 11/2014 | Nagashima | G11C 16/04 365/185.01 |
| 9,396,804 B1* | 7/2016 | Lin | G11C 8/12 |
| 9,530,506 B2 | 12/2016 | Rabkin et al. | |
| 9,972,390 B2* | 5/2018 | Lin | G06F 3/0619 |
| 10,423,492 B2* | 9/2019 | Lo | G06F 11/1402 |

OTHER PUBLICATIONS

U.S. Appl. No. 16/229,639, filed Dec. 21, 2018 by Chen et al.
U.S. Appl. No. 16/227,668, filed Dec. 20, 2018 by Chen et al.
U.S. Appl. No. 16/022,373, filed Jun. 28, 2018 by Lu et al.
U.S. Appl. No. 15/983,365, filed May 18, 2018 by Chen et al.
U.S. Appl. No. 15/959,445, filed Apr. 23, 2018 by Lu et al.
U.S. Appl. No. 15/879,084, filed Jan. 24, 2018 by Chen et al.
U.S. Appl. No. 15/814,772, filed Nov. 16, 2017 by Chen et al.

* cited by examiner

*Primary Examiner* — Pho M Luu
(74) *Attorney, Agent, or Firm* — Vierra Magen Marcus LLP

(57) ABSTRACT

Techniques for reducing read disturb of memory cells. A discharge process reduces a channel gradient in a NAND string by using a two-step ramp up of adjacent word lines of the selected word line. The voltages of the adjacent word lines can be provided at an intermediate level while the selected word line voltage is spiked up to a read pass voltage and then decreased. The voltages of the adjacent word lines can then be increased from the intermediate level to a read pass voltage and maintained at that level during the sensing of the memory cells. The voltage of the selected word line is decreased from a read pass voltage to a positive control gate read voltage at the end of the discharge process.

20 Claims, 22 Drawing Sheets

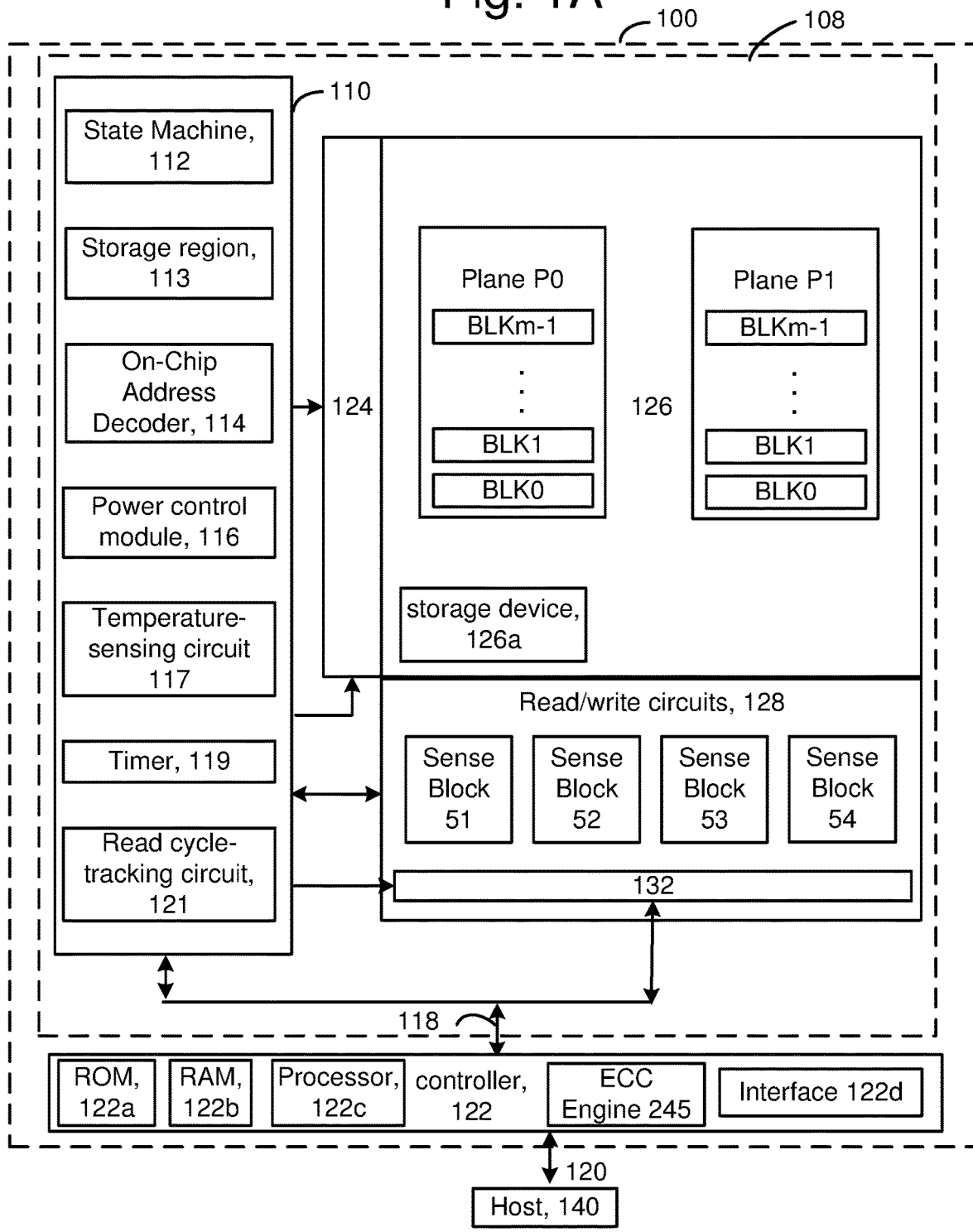

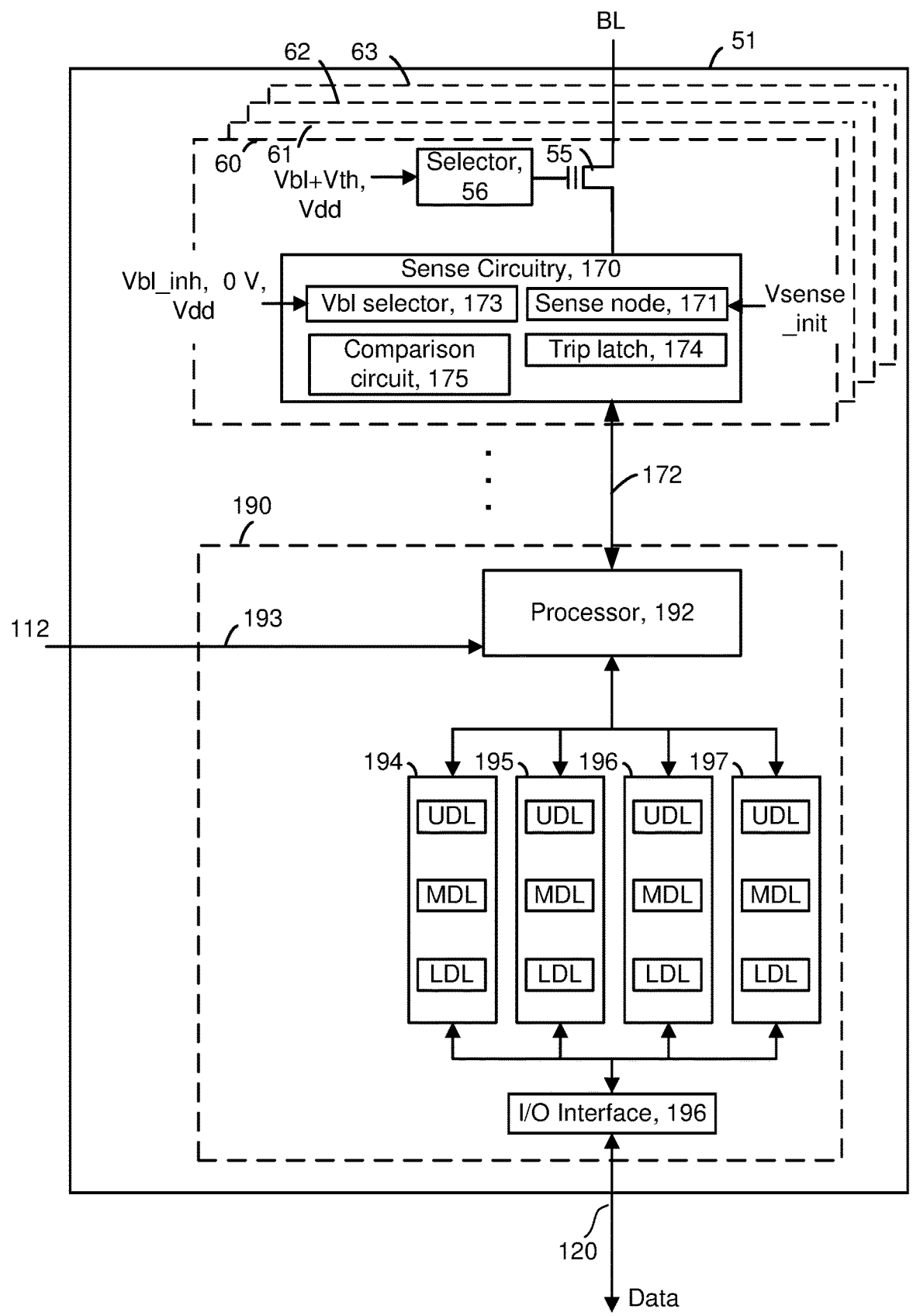

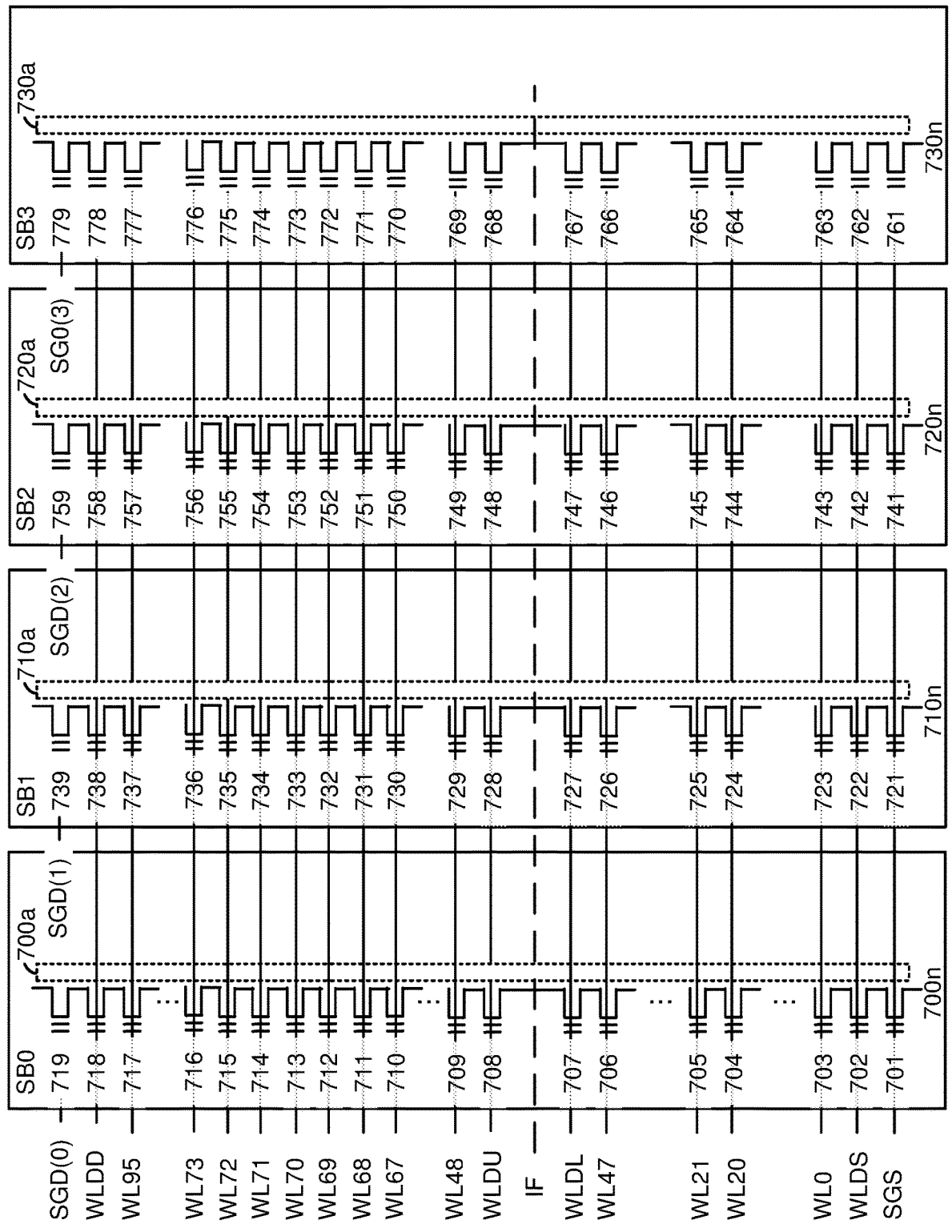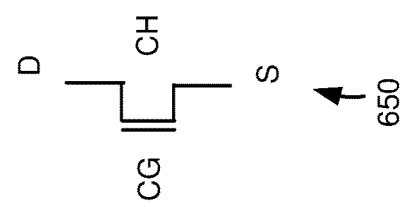

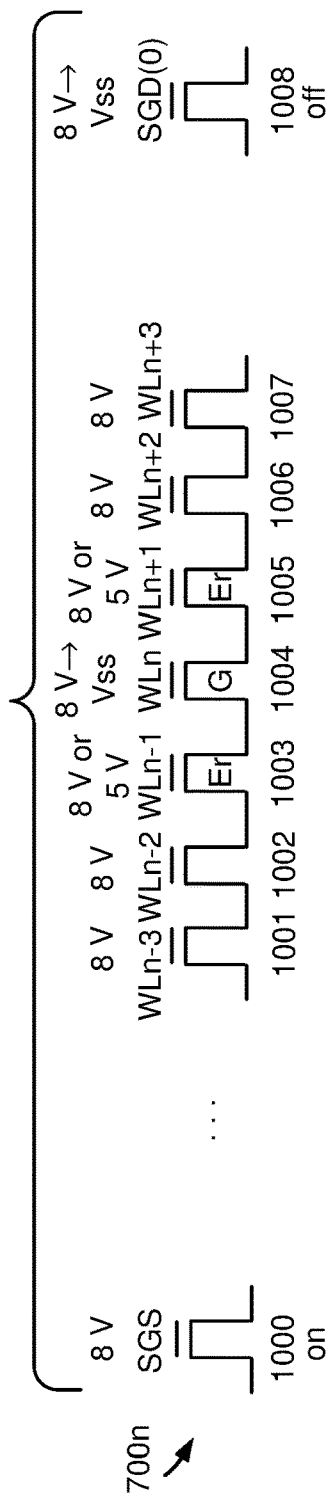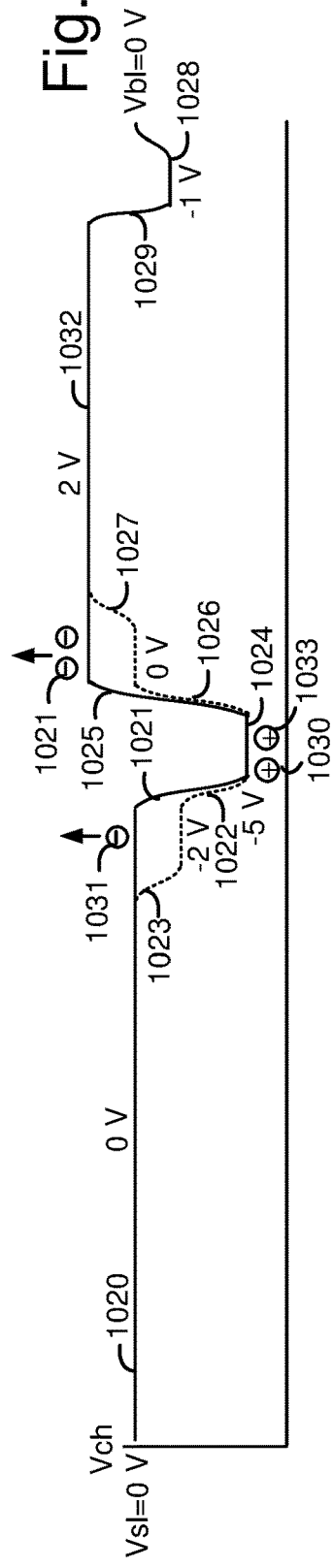

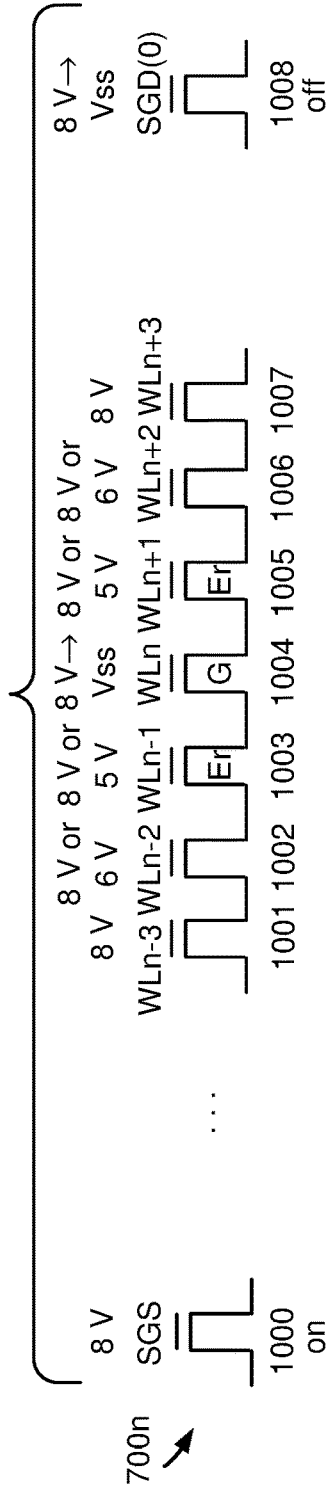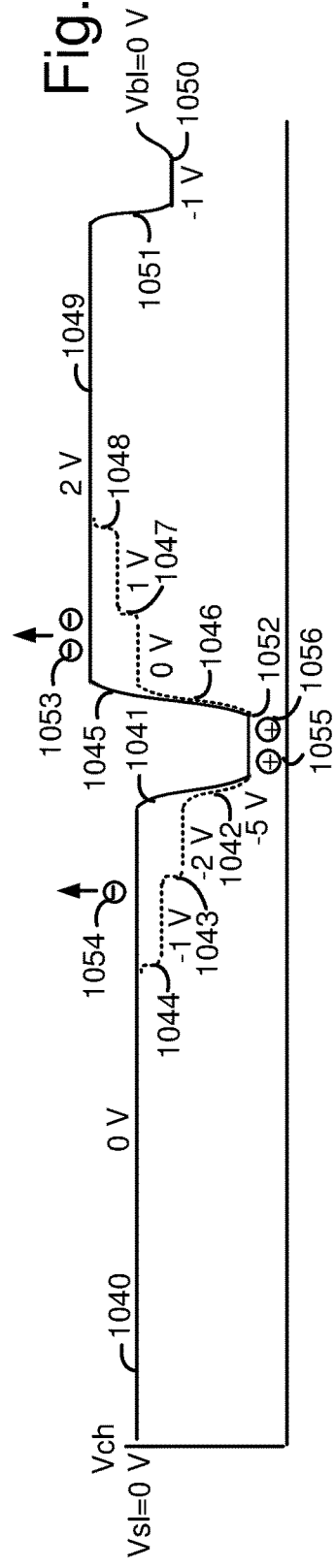

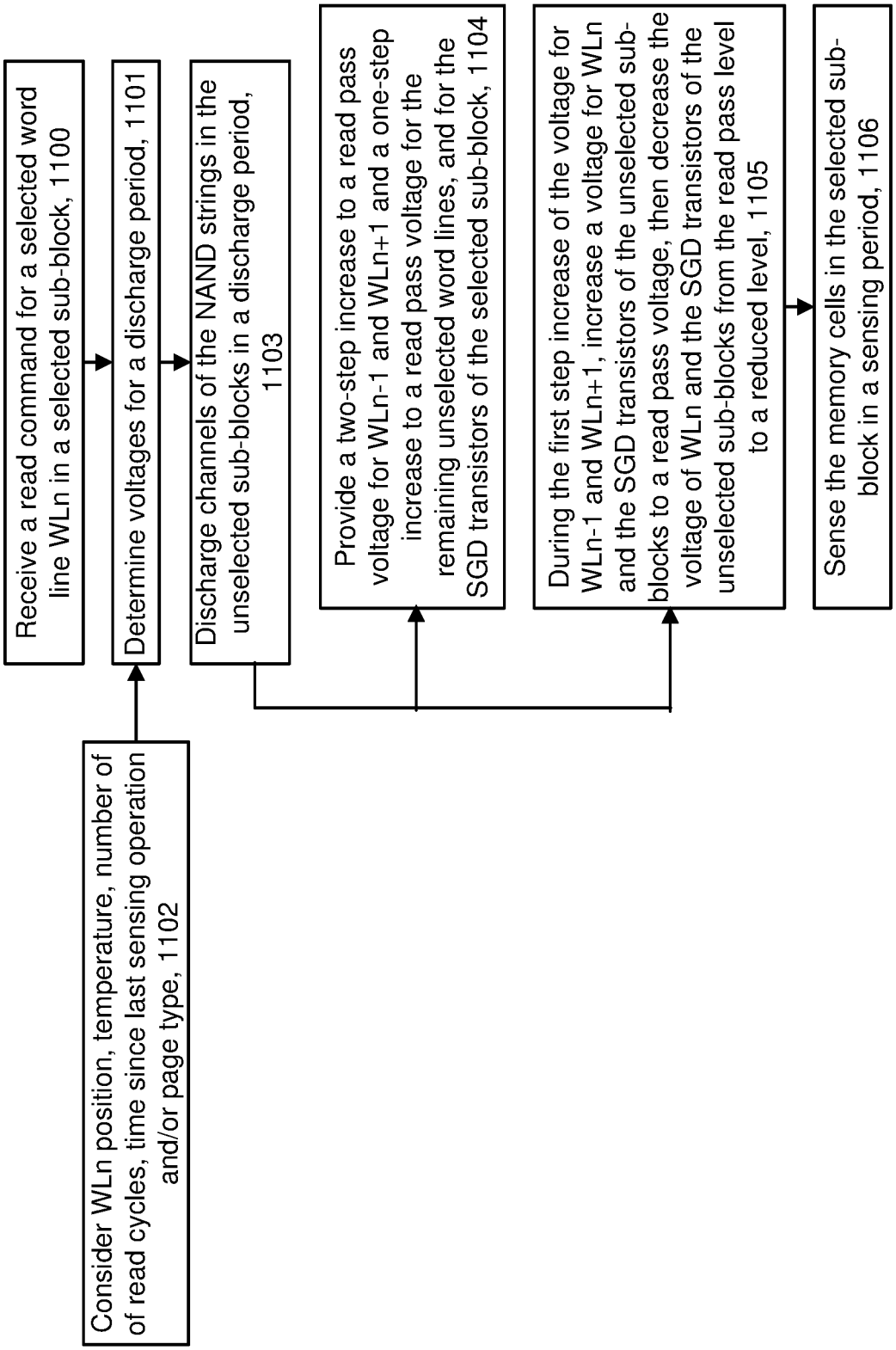

Case 1

| Word lines: | During discharge | During sensing |
|---|---|---|
| WLn+2 to WL95 | Vread | Vread |
| WLn+1 | Vint | VreadK |
| WLn-1 | Vint | VreadK |
| WL0 to WLn-2 | Vread | Vread |

Fig. 13A

Case 2

| Word lines: | During discharge | During sensing |
|---|---|---|
| WLn+3 to WL95 | Vread | Vread |
| WLn+2 | Vint | Vread |
| WLn+1 | Vint | VreadK |
| WLn-1 | Vint | VreadK |
| WLn-2 | Vint | Vread |
| WL0 to WLn-3 | Vread | Vread |

Fig. 13B

Case 3

| Word lines: | During discharge | During sensing |
|---|---|---|
| WLn+2 to WL95 | Vread | Vread |
| WLn+1 | Vint | VreadK |
| WLn-1 | VreadK | VreadK |
| WL0 to WLn-2 | Vread | Vread |

Fig. 13C

Case 4

| Word lines: | During discharge | During sensing |
|---|---|---|
| WLn+3 to WL95 | Vread | Vread |
| WLn+2 | Vint | Vread |
| WLn+1 | Vint | VreadK |
| WLn-1 | VreadK | VreadK |
| WLn-2 | Vread | Vread |
| WL0 to WLn-3 | Vread | Vread |

Fig. 13D

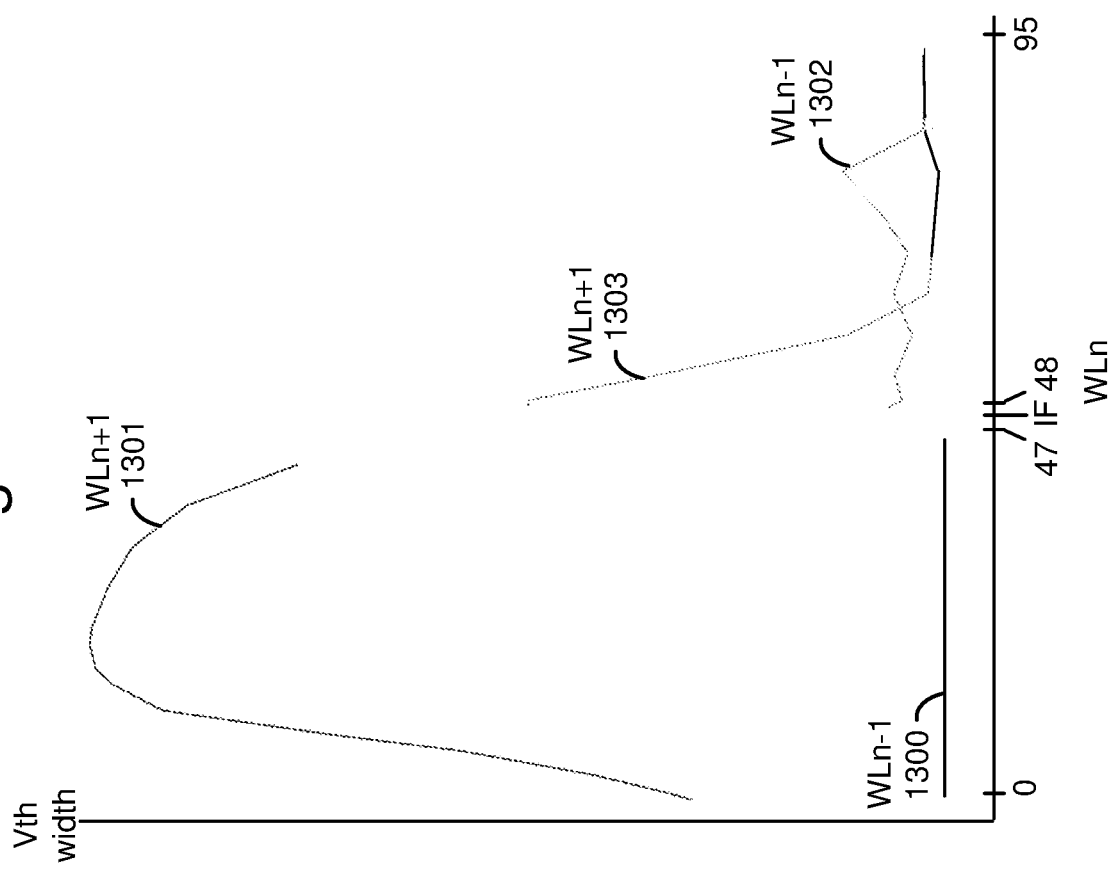

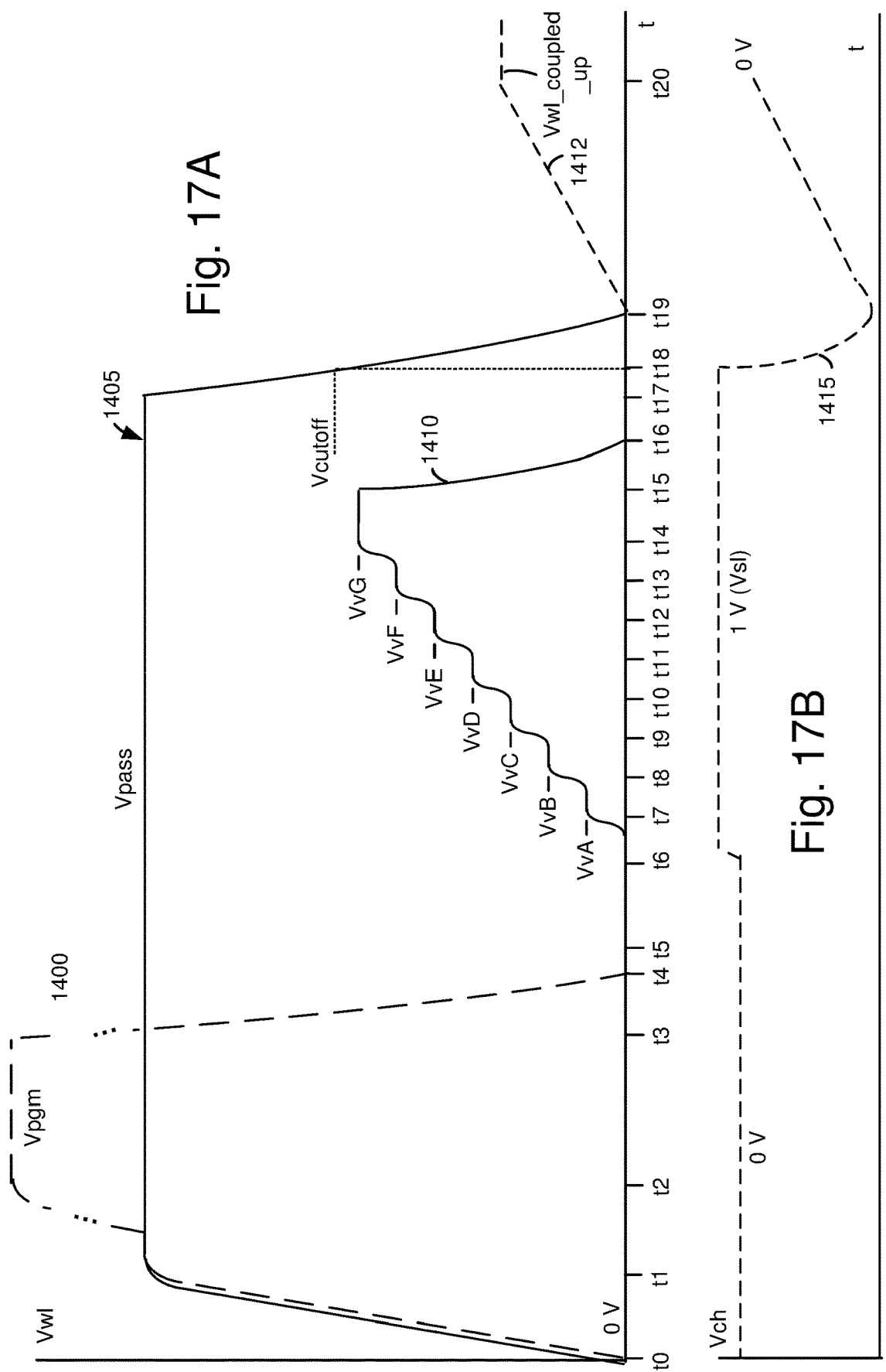

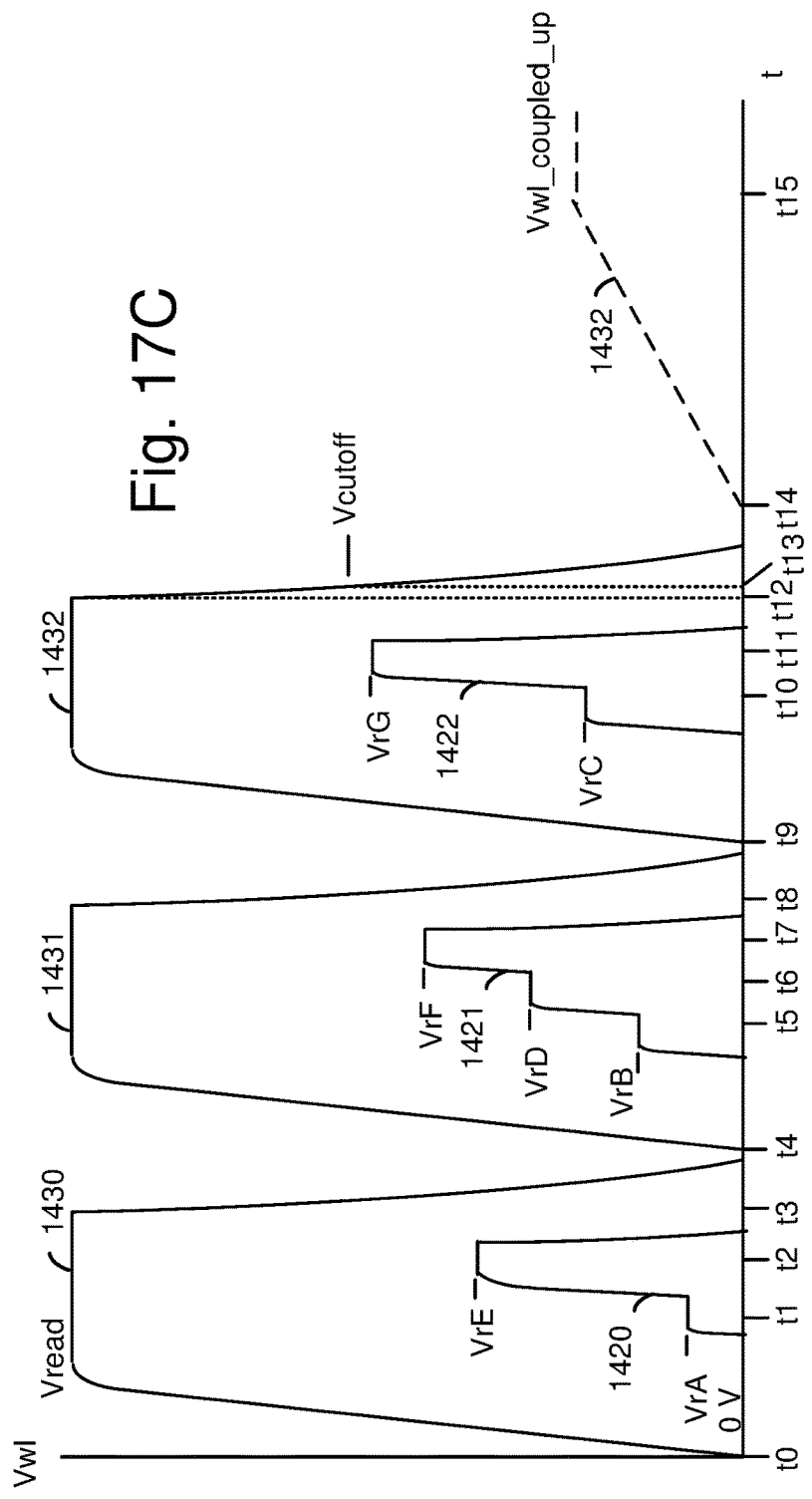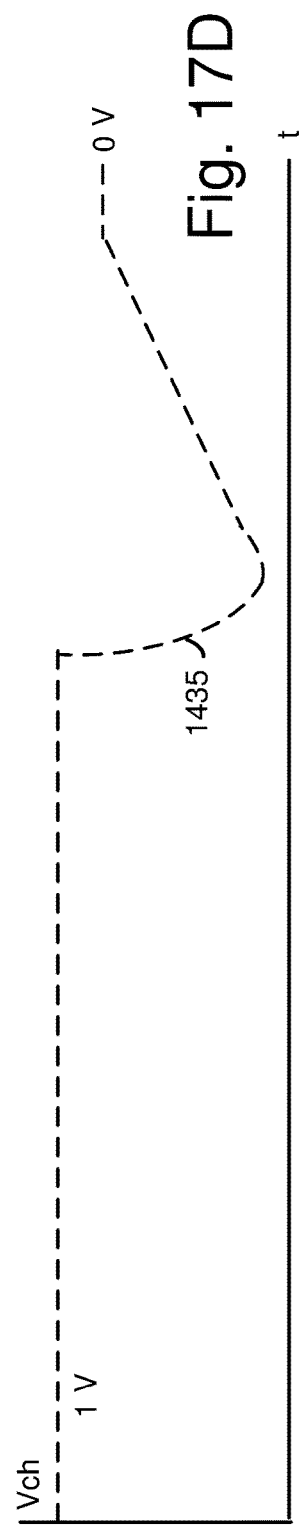

TWO-STAGE RAMP UP OF WORD LINE VOLTAGES IN MEMORY DEVICE TO SUPPRESS READ DISTURB

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of the NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 2 is a block diagram depicting one embodiment of the sense block 51 of FIG. 1.

FIG. 7A depicts an example view of NAND strings in sub-blocks in a 3D configuration which is consistent with the two-tier stack of FIG. 5.

FIG. 7B depicts an example transistor 650 which represents any of the memory cells or select gate transistors of FIG. 7A.

FIG. 10A depicts the NAND string 700n of FIG. 7A, at an end of a discharge period of a read operation, showing channel gradients which occur when WLn−1 and WLn+1 voltages are set at an example nominal level of 8 V and an example intermediate level of 5 V.

FIG. 10B depicts example channel voltages in the NAND string of FIG. 10A, with and without a read disturb countermeasure.

FIG. 10C depicts the NAND string 700n of FIG. 7A, at an end of a discharge period of a read operation, showing channel gradients which occur when WLn−2, WLn−1, WLn+1 and WLn+2 voltages are set at an example nominal level of 8 V and at example intermediate levels of 5 V and 6 V.

FIG. 10D depicts example channel voltages in the NAND string of FIG. 10C, with and without a read disturb countermeasure.

FIG. 10E depicts a modification of the NAND string 700n of FIG. 10A, where the selected word line voltage is decreased from Vread to Vcgr instead of Vss to reduce the channel gradient between WLn and WLn+1 and between WLn and WLn−1, and showing channel gradients which occur when WLn−1 and WLn+1 voltages are set at an example nominal level of 8 V and an example intermediate level of 5 V.

FIG. 10F depicts example channel voltages in the NAND string of FIG. 10E, with first and second read disturb countermeasures.

FIG. 11 depicts a flowchart of an example read operation which reduces read disturb, consistent with FIG. 10A-10F.

FIG. 13A depicts a first example of word line voltages during a discharge period and a sensing period of a read operation, consistent with FIG. 11.

FIG. 13B depicts a second example of word line voltages during a discharge period and a sensing period of a read operation, consistent with FIG. 11.

FIG. 13C depicts a third example of word line voltages during a discharge period and a sensing period of a read operation, consistent with FIG. 11, for the lower tier of a multi-tier stack.

FIG. 13D depicts a fourth example of word line voltages during a discharge period and a sensing period of a read operation, consistent with FIG. 11, for the lower tier of a multi-tier stack.

FIG. 15A depicts a plot of a Vth width versus WLn for an unselected sub-block with lower and upper tiers, for use in step 1102 of FIG. 11.

FIG. 17A depicts a plot of example waveforms in a program operation, showing coupling up of a word line voltage.

FIG. 17B depicts a plot of a channel voltage (Vch) corresponding to FIG. 17A.

FIG. 17C depicts a plot of example waveforms in a read operation, showing coupling up of a word line voltage.

FIG. 17D depicts a plot of a channel voltage (Vch) corresponding to FIG. 17C.

DETAILED DESCRIPTION

Figure 1B:
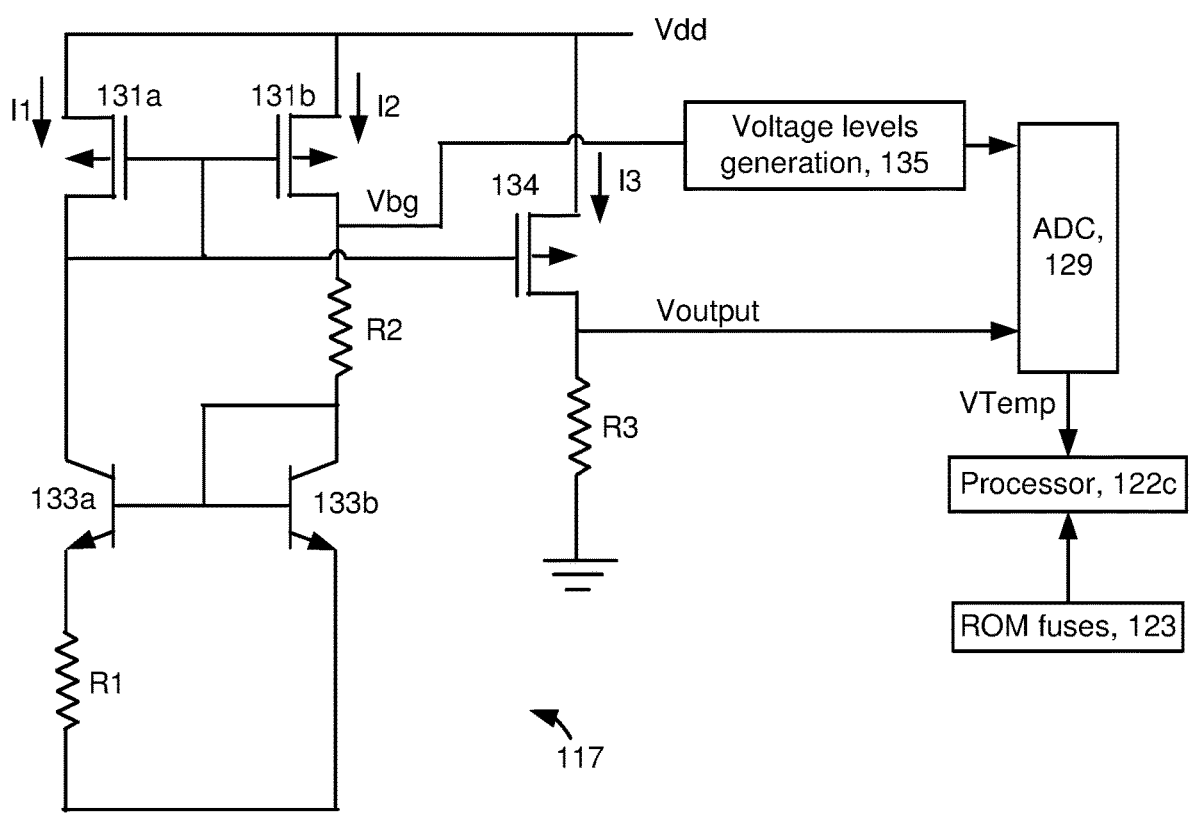
FIG. 1B depicts an example of the temperature-sensing circuit 117 of FIG. 1A.

Apparatuses and techniques are described for reducing read disturb in a memory device.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is programmed before programming a next word line. For example, a first word line, WL0, is programmed, then a second word line, WL1, is programmed and so forth until the last word line in the block is programmed A program operation may use a set of increasing program voltages which are applied to the word line in respective program loops or program-verify iterations.

Verify tests may be performed after each program voltage to determine whether the memory cells have completed programming A verify test can involve applying a control gate voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the Vth of the memory cell exceeds the control gate voltage and the memory cell has reached the assigned data state. Programming is thus completed for the memory cell, and it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command Based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states. In a three-bit per cell memory device, there are eight data states including the erased state and seven higher data states referred to as the A-G data states (see FIG. 9A). In a four-bit per cell memory device, there are sixteen data states including the erased state (S0) and fifteen higher data states (S0-S15).

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells. In one approach, a read operation occurs in a selected sub-block.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The layers may be arranged concentrically.

Each NAND string may have the shape of a pillar which intersects with the word lines to form the memory cells.

The stack can comprise one or more tiers. Due to a desire to increase the height of the stack to allow for more layers and more memory cells in each NAND string, it becomes more difficult to etch low aspect ratio memory holes in which the NAND strings are formed. One approach is to form the stack and memory holes in two (or more) tiers. The memory hole is etched separately in each tier so that a low aspect ratio can be achieved. The dielectric layer or region at the interface (IF) between the tiers is thicker than the other dielectric layers.

One challenge presented in operating memory device such as those having a 3D memory structure is that the threshold voltages of memory cells can be disturbed, e.g., upshifted, when a read operation is performed. One type of read disturb, referred to as an injection type of read disturb, has become a reliability issue in memory devices. This type of read disturb occurs when a channel gradient is formed in a channel of a NAND string. For example, see the channel gradient of plot 1025 in FIG. 10B. Electron-hole pairs are generated by the gradient, and the electrons can be drawn into the charge-trapping layer of a nearby memory cell (e.g., memory cell 1005 in FIG. 10A) by the control gate voltage of the memory cell. This electron-hole pair generation is caused by grain boundaries in the polysilicon channel. See FIGS. 10B, 10D and 10F for examples of channel gradients and electron-hole pair generation. The disturb tends to occur primarily in the memory cells which are connected to a drain-side adjacent word line, WLn+1, of the selected word line, WLn, which is being read. Moreover, the disturb tends to occur primarily in unselected NAND strings.

Read disturb can be reduced by performing a discharge process at the beginning of a read operation. See example waveforms in FIG. 12A-12F at t0-t3. The discharge process can involve applying a voltage spike on the SGS and SGD transistors and on WLn while connecting a grounding voltage or other low voltage to the drain and source ends of the NAND strings. The voltage spike allows electrons to enter the channel, thereby discharging the channel by lowering its voltage and reducing the channel gradients. The memory cells are then sensed following the discharge process.

During the voltage spike, the voltages of the unselected word line are increased to the read pass voltage. The voltage spike reduces a time in which the voltage floats in a portion of the channel on the drain-side of WLn, so that coupling up of this portion of the channel is reduced. This can significantly reduce the drain-side channel potential and prevent electron generation and injection disturb. However, the required discharge time (e.g., the spike duration) could be relatively long in some cases, undesirably increasing the time used for the read operation. For example, the required discharge time can be relatively long when the time between read operations is relatively short, since residue electrons in the channel have not had sufficient time to dissipate since the prior read operation. See FIG. 17A-17D.

Techniques provided herein address the above and other issues. In one aspect, the channels of NAND strings are discharged in a discharge process before reading selected memory cells, where the discharge process reduces a channel gradient by using a two-step ramp up of adjacent word lines of the selected word line. The voltages of the adjacent word lines can be provided at an intermediate level of the first step when the WLn voltage is spiked and, in particular, when the WLn voltage decreases from its peak level to a reduced level. The voltages of the adjacent word lines can then be increased from the intermediate level to a peak level such as a read pass voltage and maintained at that level during the sensing of the memory cells. See FIG. 12F, where the plot 1253 is an example of an intermediate level of a first step and the plots 1256 and 1257 are examples of a peak level of a second step. The time period t2-t3 depicts the WLn voltage (plot 1232) decreasing. The two-step increase reduced the channel gradients discussed, e.g., in connection with FIGS. 10B, 10D and 10F.

In one approach, the two-step ramp up is provided for the adjacent word lines WLn−1 and WLn+1 on the source and drain sides, respectively, of WLn. In another approach, the two-step ramp up is also provided for WLn−2 and WLn+2. See example cases in FIG. 13A-13D.

The intermediate level can be lower for WLn−1 and WLn+1 compared to WLn−2 and WLn+2 since read disturb is greater for the memory cells of WLn−1 and WLn+1 compared to the memory cells of WLn−2 and WLn+2. The intermediate level can be lower for WLn+1 compared to WLn−1 since read disturb is greater for the memory cells of WLn+1 compared to the memory cells of WLn−1. The intermediate level can be lower when the time since a last sensing operation is above a threshold time since read disturb is greater when the time is greater. See FIG. 14A. The intermediate level can be lower when an ambient temperature of the memory device at the time of the read operation is below a threshold temperature since read disturb is greater when the temperature is lower. See FIG. 14B. The intermediate level can be lower when a number of read cycles is higher since since read disturb is greater when the number of read cycles is higher. See FIG. 9B and FIG. 14C.

The intermediate level can be adjusted as a function of the position of WLn in a stack comprising one or more tiers. See FIGS. 15A and 15B.

The read pass voltage can be higher for the adjacent unselected word lines WLn−1 and WLn+2 than for other unselected word lines.

In another aspect, the channels of NAND strings are discharged in a discharge process before reading selected memory cells, where the discharge process reduces a channel gradient by decreasing the voltage of the selected word line from a read pass voltage, Vread, to a control gate read voltage, Vcgr, which is greater than 0 V. See FIG. 12C-12E and the plots 1223, 1233 and 1243. This feature can be used alone or combined with the feature of using a two-step ramp up of adjacent word lines of the selected word line. Vcgr can be based on a type of page which is read from the selected word line, e.g., a lower, middle or upper page.

These and other features are discussed further below.

FIG. 1A is a block diagram of an example memory device. The memory device 100, such as a non-volatile storage system, may include one or more memory die 108, also referred to as a chip or integrated circuit. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. In one embodiment, the memory structure comprise blocks of memory cells arranged in one or more planes. For example, blocks BLK0-BLKm−1 are arranged in each of planes P0 and P1. A plane may be an area of a substrate with a diffusion layer (such as the well region 433 in FIG. 3) which is common to each block in the plane, in one approach. The blocks in a plane typically share a common set of bit lines.

The read/write circuits 128 include multiple sense blocks 51-54 (sensing circuitry) and allow a page of memory cells to be read or programmed in parallel. Typically a controller 122 is included in the same memory device 100 (e.g., a removable storage card) as the one or more memory die 108. The controller may be separate from the memory die, e.g., an off-chip controller. Commands and data are transferred between the host 140 and controller 122 via a data bus 120, and between the controller and the one or more memory die 108 via a path 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, a storage region 113, an on-chip address decoder 114, a power control module 116 (power control circuit), a temperature-sensing circuit 117, a timer 119 and a read-cycle tracking circuit 121. The state machine 112 provides chip-level control of memory operations. The storage region 113 may be provided for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

The temperature-sensing circuit may be used to detect an ambient temperature of the memory device. See FIG. 1B. The temperature can be used to adjust an intermediate voltage Vint as discussed in connection with FIG. 14B.

The timer 119 may be used to determine a time which has elapsed since a last sensing operation, such as a verify operation during programming or a read operation. The timer may increment based on a clock signal used in the memory device. The time can be used to adjust an intermediate voltage Vint as discussed in connection with FIG. 14A.

The read-cycle tracking circuit may be used to track a number of read cycles in the lifetime of a memory device or portion of the device such as blocks of memory cells. A read cycle can comprise a read operation involving reading of one or more pages of data, for example. The number of read cycles can be used to adjust an intermediate voltage Vint as discussed in connection with FIG. 14C.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110 and its components, state machine 112, decoders 114 and 132, sense blocks 51-54, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the processes described herein, including the processes of the flowchart of FIG. 1.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 117 of FIG. 1A. The circuit includes pMOSFETs 131$a$, 131$b$ and 134, bipolar transistors 133$a$ and 133$b$ and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122c. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR' d together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
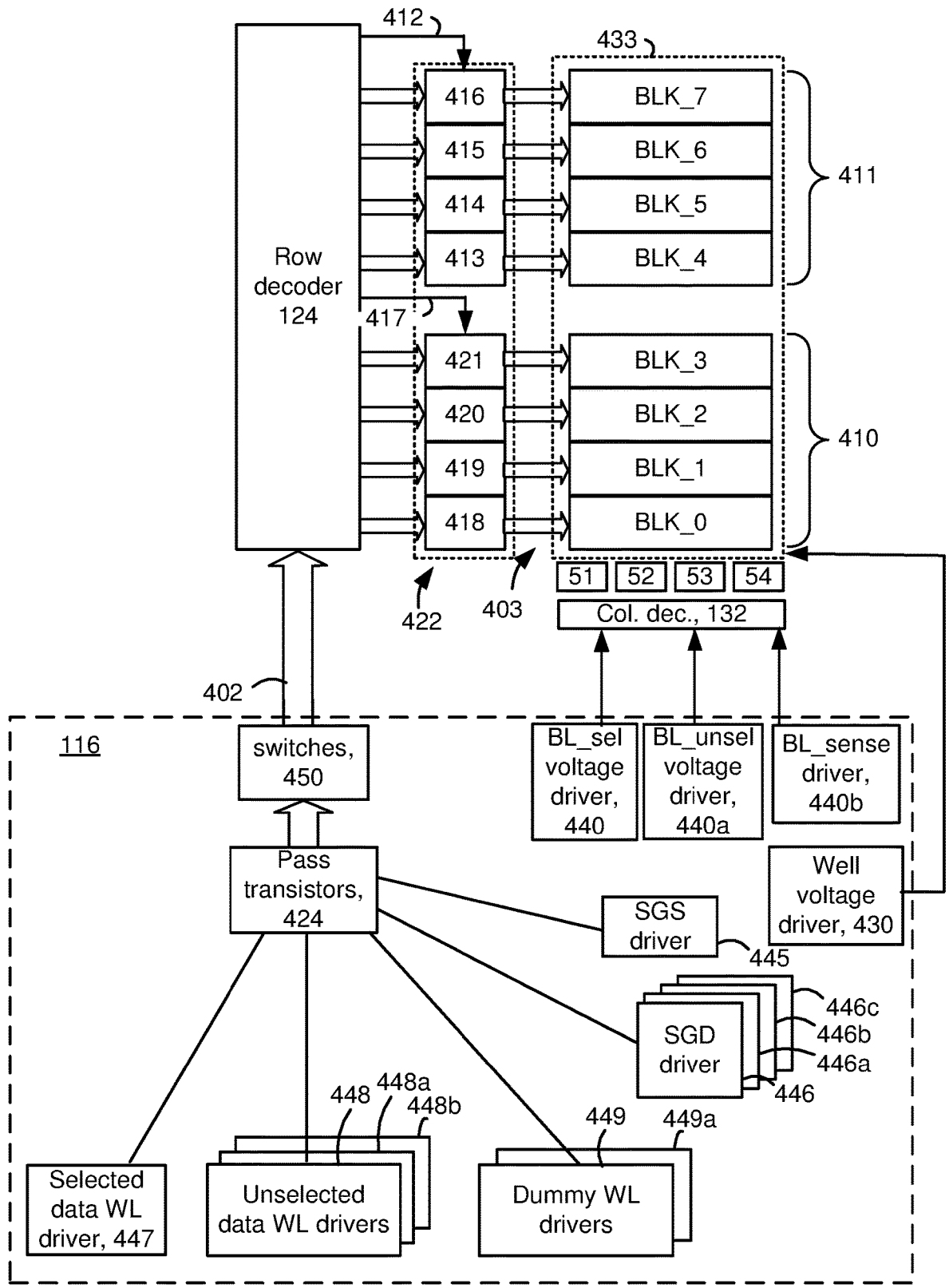
FIG. 3 depicts an example implementation of the power control module 116 of FIG. 1.

FIG. 3 depicts an example implementation of the power control module 116 of FIG. 1. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The voltage drivers can also include drivers 448, 448*a* and 448*b* for unselected data word lines. These can be remaining, unselected word lines other than the selected word line. As depicted below, e.g., in connection with FIGS. 10A-F and 12A-12F, these drivers can be used to provide different voltage signals for word line voltages during the discharge and sensing phases of a read operation. For example, the driver 448 could be used for Wn−1 and WLn+1, the driver 448*a* could be used for Wn−2 and WLn+2, and the driver 448*b* could be used for the remaining unselected data word lines, e.g., WL0-WLn−3 and WLn+3-WL95. Additional voltage drivers can be provided as needed based on the number of different voltage signals.

The voltage drivers can also include dummy word line drivers 449 and 449*a*. For example, the driver 449 could be used for a lower dummy interface word line WLDL and an upper dummy interface word line WLDU, and the driver 449*a* could be used for WLDD and WLDS. See FIG. 5. WLDU is adjacent to and above an interface of a multi-tier stack, and WLDL is adjacent to and below the interface. Separate drivers could also be provided for each interface dummy word line, and for each of WLDD and WLDS.

The voltage drivers can also include separate SGD drivers for each sub-block in a block. For example, in BLK0 as depicted in FIG. 7A, SGD drivers 446, 446*a*, 446*b* and 446*c* can be provided for SGD(0)-SGD(3), respectively, in SB0-SB3, respectively. In one option, one SGS driver 445 is common to the different sub-blocks in a block. In another option, separate SGS drivers are provided for each sub-block of a block. Moreover, in some cases, there can be multiple SGD transistors, multiple SGS transistors, multiple drain-side dummy memory cells and/or multiple source-side dummy memory cells in each NAND string. To provide the greatest flexibility in programming these memory cells and transistors with program voltages or other word line specific parameters, there can be a separate driver for each select gate transistor and dummy memory cell in a NAND string, in one approach. Or, for simplicity, the multiple SGD transistors may be connected and commonly driven, the multiple SGS transistors may be connected and commonly driven, the multiple drain-side dummy memory cells may be connected and commonly driven and the multiple source-side dummy memory cells may be connected and commonly driven.

The various components, including the row decoder, may receive commands from a controller such as the state machine 112 or the controller 122 to perform the functions described herein.

In one approach, the well region 433 is common to the blocks and may be driven by a voltage driver 430. A set of bit lines is also shared by the blocks. During a program operation, a BL_sel bit line voltage driver 440 provides voltages to the selected bit lines and a BL_unsel bit line voltage driver 440a provides voltages to the unselected bit lines. During a sensing operation, a BL_sense bit line voltage driver 440b provides voltages to the bit lines.

In a stacked memory device such as depicted in FIGS. 4 to 8, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach. The vertically extending NAND strings have a floating channel.

Figure 4:
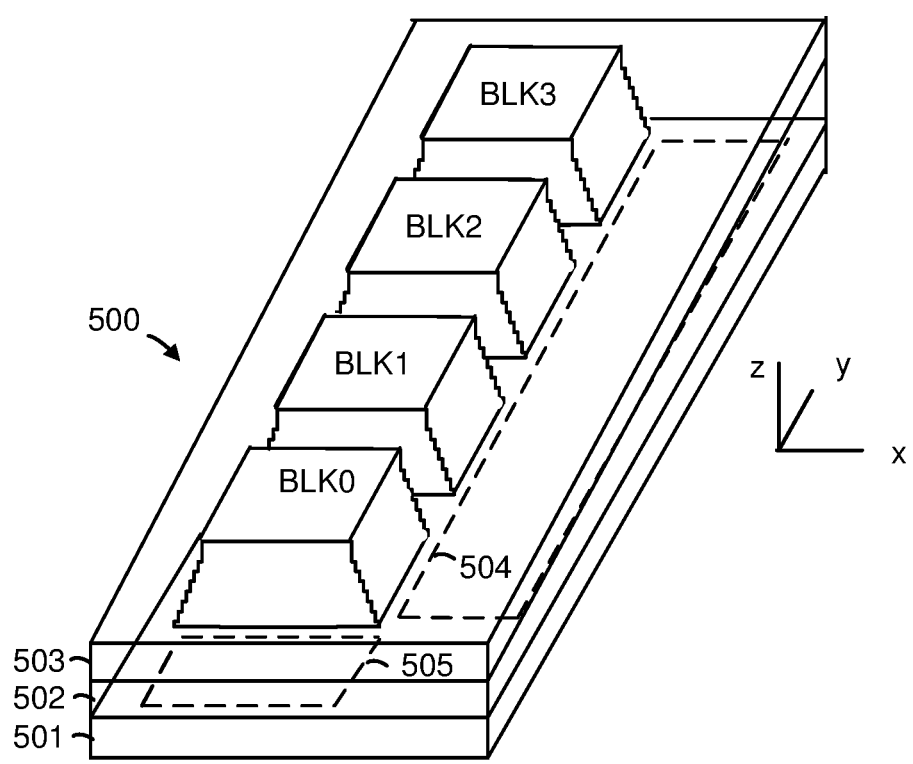
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1A. On the substrate 501 are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
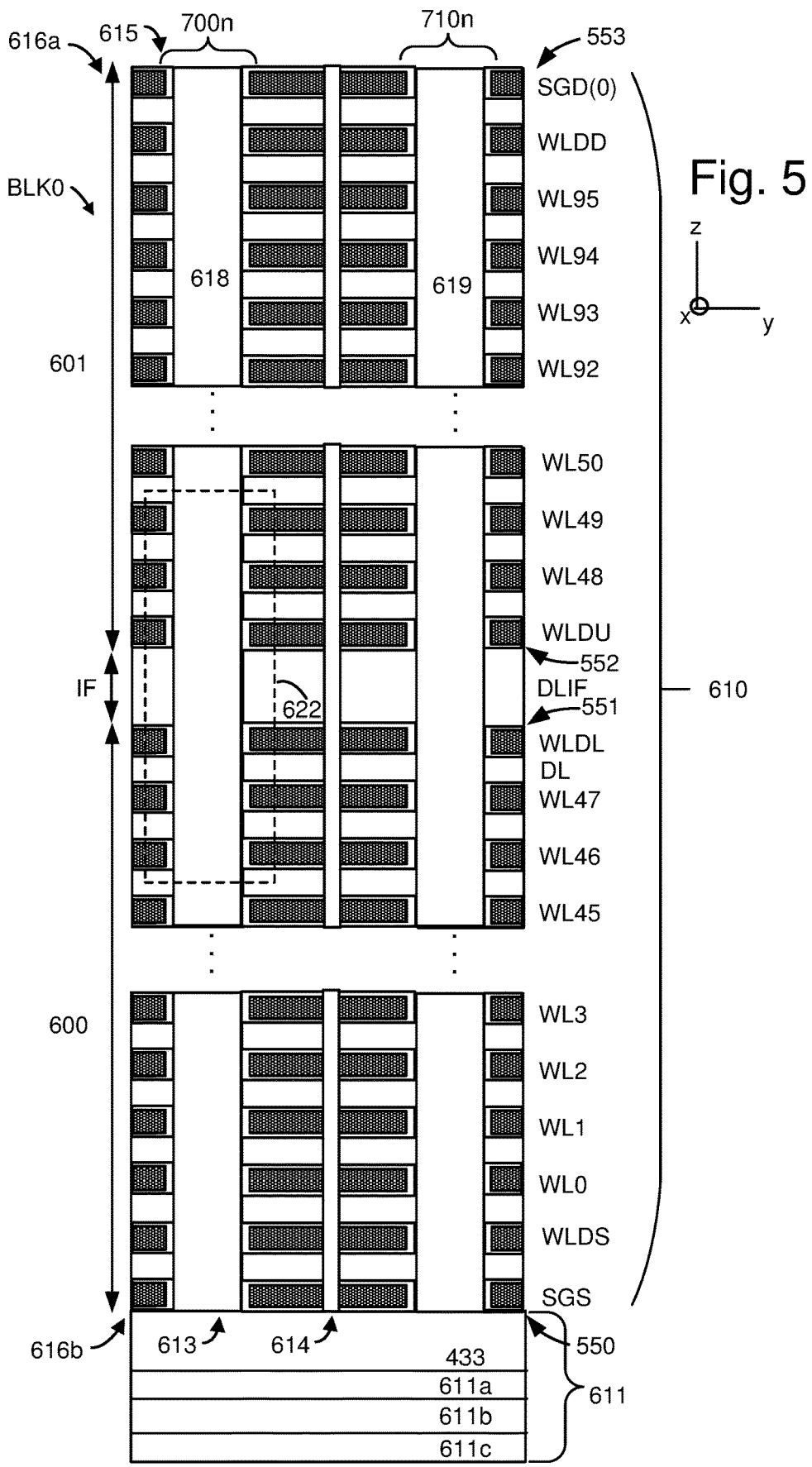
FIG. 5 depicts an example cross-sectional view of a portion of BLK0 of FIG. 4, including NAND strings 700n and 710n.

FIG. 5 depicts an example cross-sectional view of a portion of BLK0 of FIG. 4, including NAND strings 700n and 710n. The block comprises a stack 610 of alternating conductive layers (word line layers) and dielectric layers. The stack can include one or more tiers of alternating conductive and dielectric layers. A tier may refer to a set of alternating conductive and dielectric layers in which a memory hole is formed in a fabrication process. A two-tier stack has different read disturb characteristics based on the position of the selected word line, as discussed in connection with FIGS. 15A and 15B.

In this example, the stack includes two tiers, including a lower tier 600 (e.g., a first tier or a bottom tier) and an upper tier 601 (e.g., a second tier or a top tier). The tiers are separated by an interface (IF) (or interface region or junction) which is formed of dielectric material. The conductive layers comprise SGS, WLDS, WL0-WL47, WLDL, WLDU, WL48-WL95, WLDD and SGD(0). WLDS, WLDL, WLDU and WLDD are dummy word lines or conductive layers connected to dummy memory cells which are ineligible to store user data, WL0-WL47 are data word lines or conductive layers in the lower tier connected to data memory cells which are eligible to store user data, and WL48-WL95 are data word lines in the upper tier. As an example only, the stack includes ninety-six data word lines, and the data word lines are evenly divided between the two tiers. DL is an example dielectric layer outside the interface, and DLIF is a dielectric layer of the interface.

A top 553 of the upper tier and the stack is depicted along with a bottom 552 of the upper tier, a top 551 of the lower tier and a bottom 550 of the lower tier and the stack. WL47 is the topmost data word line or conductive layer of the lower tier and WL0 is the bottommost data word line or conductive layer of the lower tier.

WLDL and WLDU are examples of unselected word lines adjacent to the interface, and WL0-WL47 and WL48-WL95 are examples of unselected word lines non-adjacent to the interface in the lower and upper tiers, respectively.

The NAND strings each comprise a memory hole 618 or 619, respectively, which is filled with materials which form memory cells adjacent to the word lines. For example, see region 622 of the stack which is shown in greater detail in FIG. 6.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

Figure 6:
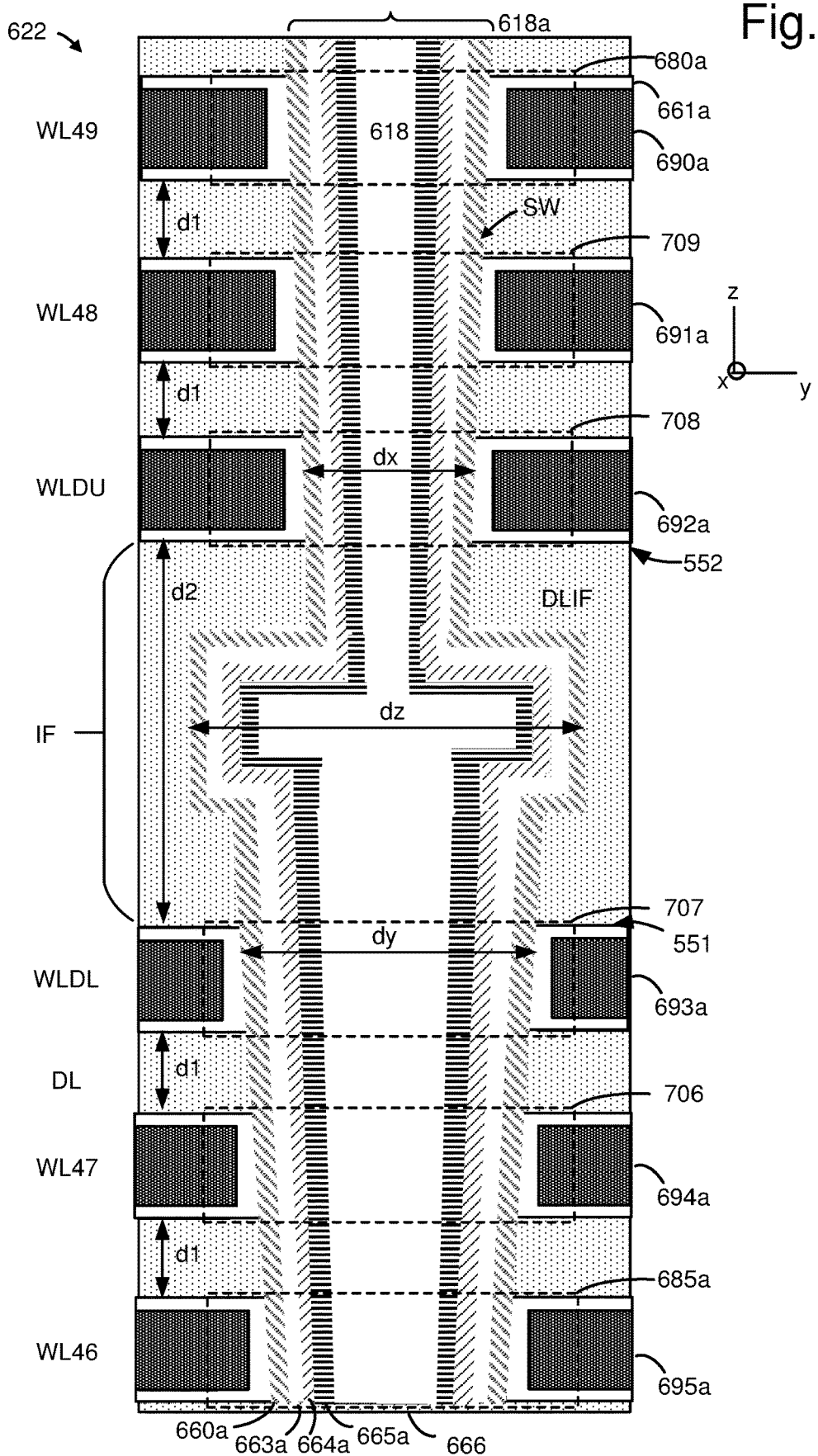
FIG. 6 depicts a close-up view of the region 622 of the stack of FIG. 5.

FIG. 6 depicts a close-up view of the region 622 of the stack of FIG. 5. The region includes the three word lines below the interface, WL46, WL47 and WLDL, and the three word lines above the interface, WLDU, WL48 and WL49. Generally, the NAND string comprises memory cells connected to respective word lines. This example includes memory cells 680a, 709, 708, 707, 706 and 685a connected to word lines WL49, WL48, WLDU, WLDL, WL47 and WL46, respectively. The word lines or word line layers are spaced apart by dielectric layers, which each have a thickness or height of d1 (a first distance) outside the interface, and by DLIF, which has a larger thickness or height of d2 (a second distance) in the interface. D1 and d2 are also inter-cell distances, or distances between adjacent memory cells along the z or vertical axis. In one approach, d2 is at least 1.5-4 times the height of d1. DLIF can be an aggregated layer which is made up of dielectric materials which are deposited in one or more separate layers on top of one another. The thickness or height of d2 of the interface is greater than a height of dielectric layers between the data memory cells.

The memory cell 708 is connected to WLDU, and is adjacent to and above the interface. The memory cell 707 is connected to WLDL, and is adjacent to and below the interface. These are interface memory cells. The second distance spans the interface. In some cases, the memory cells 708 and 707 can be set as dummy memory cells which are ineligible to store user data, due to the difficulty in controlling the channel region along the interface. WLDU and WLDL are dummy word lines in this case.

The memory hole which is etched through each tier of the stack has a tapered shape, e.g., wider at the top and narrower at the bottom. As a result, the memory hole diameter dy at the top word line layer or memory cell in the lower tier is larger than the memory hole diameter dx at the bottom word line layer or memory cell in the upper tier. A diameter dz represents a widest region of the memory hole. This widened region is used to accommodate small misalignments in the memory hole portion of the upper tier relative to the memory hole portion in the lower tier. The increased thickness d2 of DLIF is provided due to process margin concerns and also accommodates misalignment by providing a transition region between the memory hole portions in the two tiers.

The diameter of the memory hole thus changes abruptly partway along a height of the memory hole.

A number of layers or films can be deposited along the sidewall of the memory hole. The layers can conform to the changing diameter in the interface. For example, the layers can include a blocking oxide/block high-k material 660a, a charge-trapping layer 663a (e.g., silicon nitride ($Si_3N_4$) or other nitride), a tunneling layer 664a (e.g., oxide) and a channel 665a layer (e.g., polysilicon). A dielectric core 666 (e.g., silicon dioxide) fills a remainder of the memory hole. A pillar 618a or column can be formed by the materials within a memory hole as an active area of a NAND string. Referring to WL49 as an example, a word line layer can include a metal barrier 661a, and a conductive metal 662a as a control gate. For example, control gates 690a, 691a, 692a, 693a, 694a and 695a are provided. The NAND string can be considered to have a floating body channel because the length of the channel is not formed on a substrate. When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

In FIGS. 5 and 6, a NAND string 700n, 710n extends in a memory hole 618, 619, and the memory hole comprises a portion in the lower tier and a portion in the upper tier. Also, at the interface (IF), a width dy of the portion in the lower tier is greater than a width dx of the portion in the upper tier.

Although this figure depicts a stack having two tiers, the read disturb countermeasures described herein as application to a stack having one or more tiers unless otherwise noted.

FIG. 7A depicts an example view of NAND strings in sub-blocks in a 3D configuration which is consistent with the two-tier stack of FIG. 5. Each sub-block includes multiple NAND strings or other sets of memory cells connected to one another, where one example NAND string is depicted for each sub-block. The memory cells in a set may be connected to one another serially. For example, SB0, SB1, SB2 and SB3 comprise example NAND strings 700n, 710n, 720n and 730n, respectively. In this example, each NAND string has one SGD transistor, one drain-side dummy memory cell, ninety-six data memory cells (where 48 are above the interface IF, i.e., connected to WL48-WL95, and forty-eight are below the interface, i.e., connected to WL0-WL47), one source-side dummy memory cell and one SGS transistor.

In the block BLK0, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source end word line and proceeding one word line at a time to WL95, the drain end data word line.

The NAND strings 700n, 710n, 720n and 730n have channels 700a, 710a, 720a and 730a, respectively. Each channel can extend continuously from a source end select gate transistor to a drain end select gate transistor. For example, the channel 700a extends continuously in the NAND strings 700n from the SGS transistor 701 to the SGD transistor 719. The channel 700a is continuous in that it is uninterrupted and can therefore provide a continuous conductive path in the NAND string.

NAND string 700n includes SGS transistor 701, source-side dummy memory cell 702 connected to WLDS, example lower tier data memory cells 703-706 associated with example associated word lines WL0-WL47, interface-adjacent dummy memory cells 707 and 708 connected to WLDL and WLDU, respectively, example upper tier data memory cells 709-717 associated with WL48-WL95, drain-side dummy memory cell 718 connected to WLDD, and SGD transistor 719 connected to SGD(0).

NAND string 710n includes SGS transistor 721, source-side dummy memory cell 722 connected to WLDS, example lower tier data memory cells 723-726 associated with WL0-WL47, interface-adjacent dummy memory cells 727 and 728 connected to WLDL and WLDU, respectively, example upper tier data memory cells 729-737 associated with WL48-WL95, drain-side dummy memory cell 738 connected to WLDD, and SGD transistor 739 connected to SGD(1).

NAND string 720n includes SGS transistor 741, source-side dummy memory cell 742 connected to WLDS, example lower tier data memory cells 743-746 associated with WL0-WL47, interface-adjacent dummy memory cells 747 and 748 connected to WLDL and WLDU, respectively, example upper tier data memory cells 749-757 associated with WL48-WL95, drain-side dummy memory cell 758 connected to WLDD, and SGD transistor 759 connected to SGD(1).

NAND string 730n includes SGS transistor 761, source-side dummy memory cell 762 connected to WLDS, example lower tier data memory cells 763-766 associated with WL0-WL47, interface-adjacent dummy memory cells 767 and 768 connected to WLDL and WLDU, respectively, example upper tier data memory cells 769-777 associated with WL48-WL95, drain-side dummy memory cell 778 connected to WLDD, and SGD transistor 779 connected to SGD(1).

In this example, the dummy memory cells 708, 728, 748 and 768 are adjacent to and above the interface, and the dummy memory cells 707, 727, 747 and 767 are adjacent to and below the interface.

FIG. 7B depicts an example transistor 650 which represents any of the memory cells or select gate transistors of FIG. 7A. The transistor comprises a control gate CG, a drain D, a source S and a channel CH and may represent a memory cell or a select gate transistor, for example.

Figure 8:
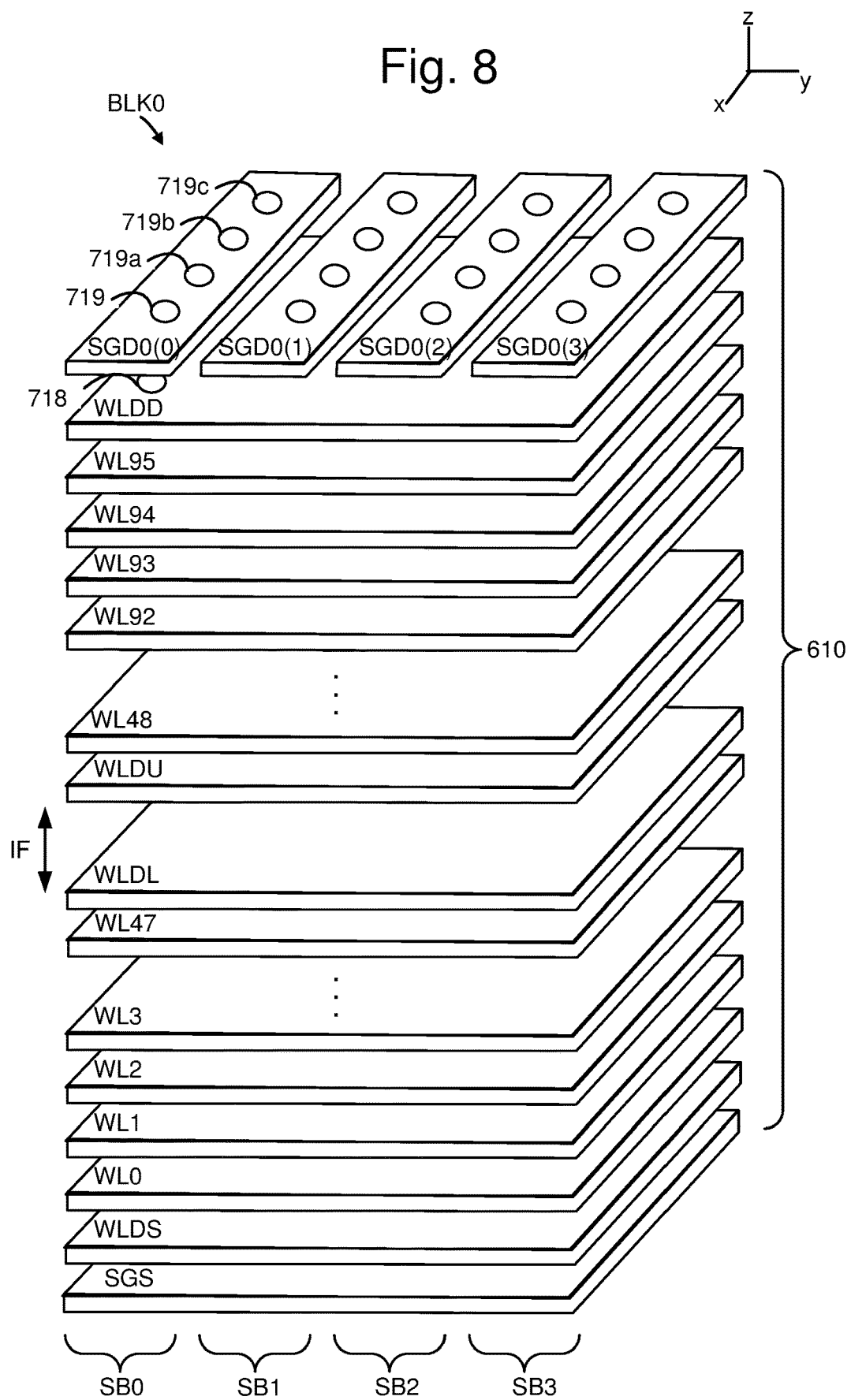
FIG. 8 depicts control gate layers in BLK0 consistent with FIG. 5-7A.

FIG. 8 depicts control gate layers in BLK0 consistent with FIG. 5-7A. The control gate layers are arranged in the stack 610 and include the layers SGS, WLDS, WL0-WL47, WLDL, WLDU, WL48-WL95, WLDD and SGD(0)-SGD(3). The SGS control gate layer is common for the block. Optionally, a separate SGS control gate layer could be provided for each sub-block. Additionally, four example memory holes are depicted in each sub-block. As mentioned, select gate transistors and memory cells can be formed along each memory hole in a NAND string. For example, SGD transistors 719, 719a, 719b and 719c are depicted in SGD0 (0), and a dummy memory cell 718 is depicted in WLDD.

Figure 9A:
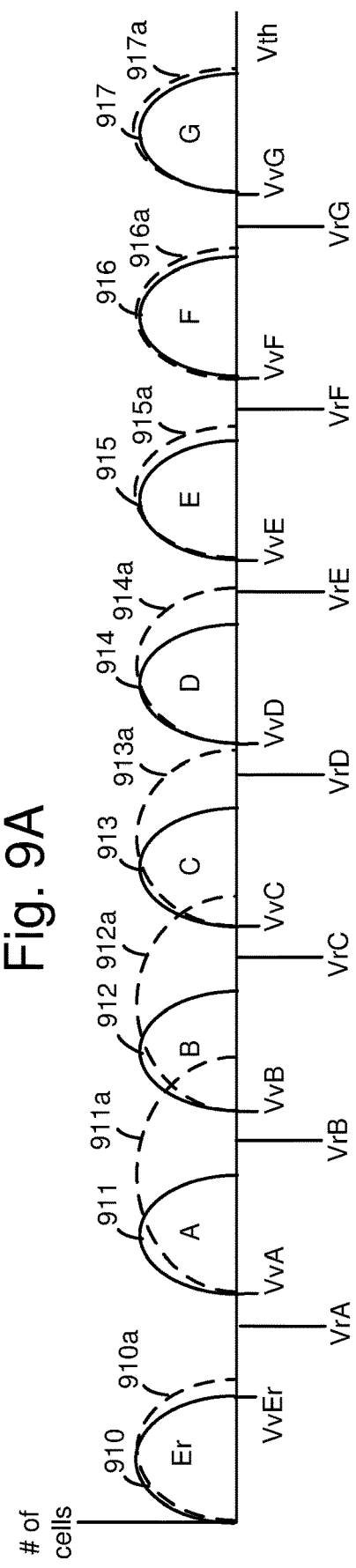
FIG. 9A depicts an example Vth distribution of a set of MLC memory cells in eight data states, with and without read disturb.

FIG. 9A depicts an example Vth distribution of a set of MLC memory cells in eight data states, with and without read disturb. The memory cells are connected to a selected word line. Verify voltages VvA, VvB, VvC, VvD, VvE, VvF and VvG are associated with the A, B, C, D, E, F and G data states, respectively. The program operation is completed when the Vth of the programmed memory cells exceeds the respective verify voltage of the assigned data state.

At a start of a program operation, the memory cells are all initially in the erased state as represented by the Vth distribution 910. After the program operation is successfully completed, the memory cells assigned to the Er state are represented by the Vth distribution 910a. The Vth distribution of the Er state is upshifted due to program disturb.

The memory cells which are programmed to the A, B, C, D, E, F and G states are represented by the Vth distributions 911, 912, 913, 914, 915, 916 and 917, respectively, immediately after programming is completed, and before read disturb. The verify voltages are used in the verify operations or tests of the memory cells. These verify voltages are also referred to as final verify voltages.

After read disturb occurs, the Vth distributions are widened and the upper tail is shifted higher, as represented by the Vth distributions 911a, 912a, 913a, 914a, 915a, 916a and 917a for the A, B, C, D, E, F and G states, respectively. Read disturb can result in read errors if the Vth of a memory cell is increased above a read voltage. For example, the upper tail of the Vth distribution 911a exceeds VrB so that the associated memory cells will be read as being in the B-state and not the A state. See also FIG. 10A-10F for further details of a read disturb mechanism. The read disturb shown represents the case with a read stress caused by hundreds of repeated read operations or read cycles. This read stress can occur, for instance, for data at a server where the data is repeatedly read. The read disturb is typically larger for the lower data states than the higher data states. Read voltages VrA, VrB, VrC, VrD, VrE, VrF and VrG can be used for reading the states of the memory cells in a read operation.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied.

As discussed further below, read disturb can occur in particular on memory cells connected to WLn−1 and WLn+1, where WLn is the word line being read, WLn+1 is the drain-side adjacent word line (or word line layer) of WLn and WLn−1 is the source-side adjacent word line (or word line layer) of WLn. Read disturb can occur in both selected and unselected sub-blocks and may be worse in unselected sub-blocks.

Figure 9B:
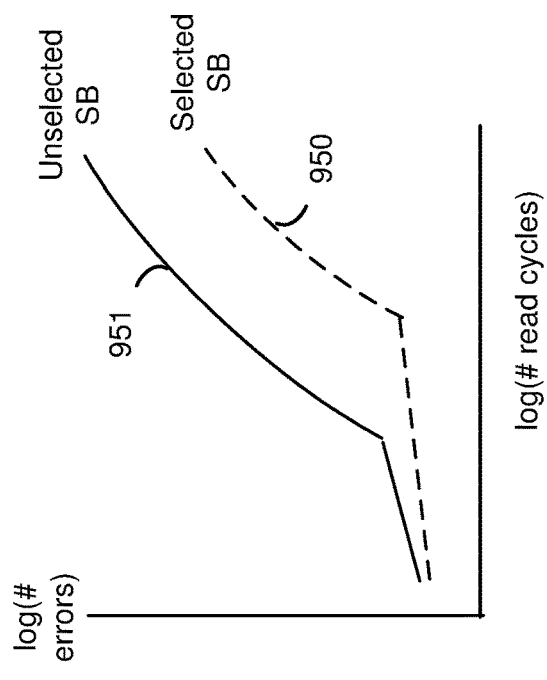
FIG. 9B depicts a plot of a number of read errors versus a number of read cycles, for a selected sub-block (plot 950) and an unselected sub-block (plot 951).

FIG. 9B depicts a plot of a number of read errors versus a number of read cycles, for a selected sub-block (plot 950) and an unselected sub-block (plot 951). The vertical and horizontal axes have logarithmic scales. The number of read errors increases at a relatively slow rate and then at a much higher rate as the number of read cycles increases. Moreover, the selected sub-block refers to the sub-block comprising memory cells being read in a read operation and the unselected sub-blocks refer to the remaining sub-blocks in a block.

Figures 10E, 10F:
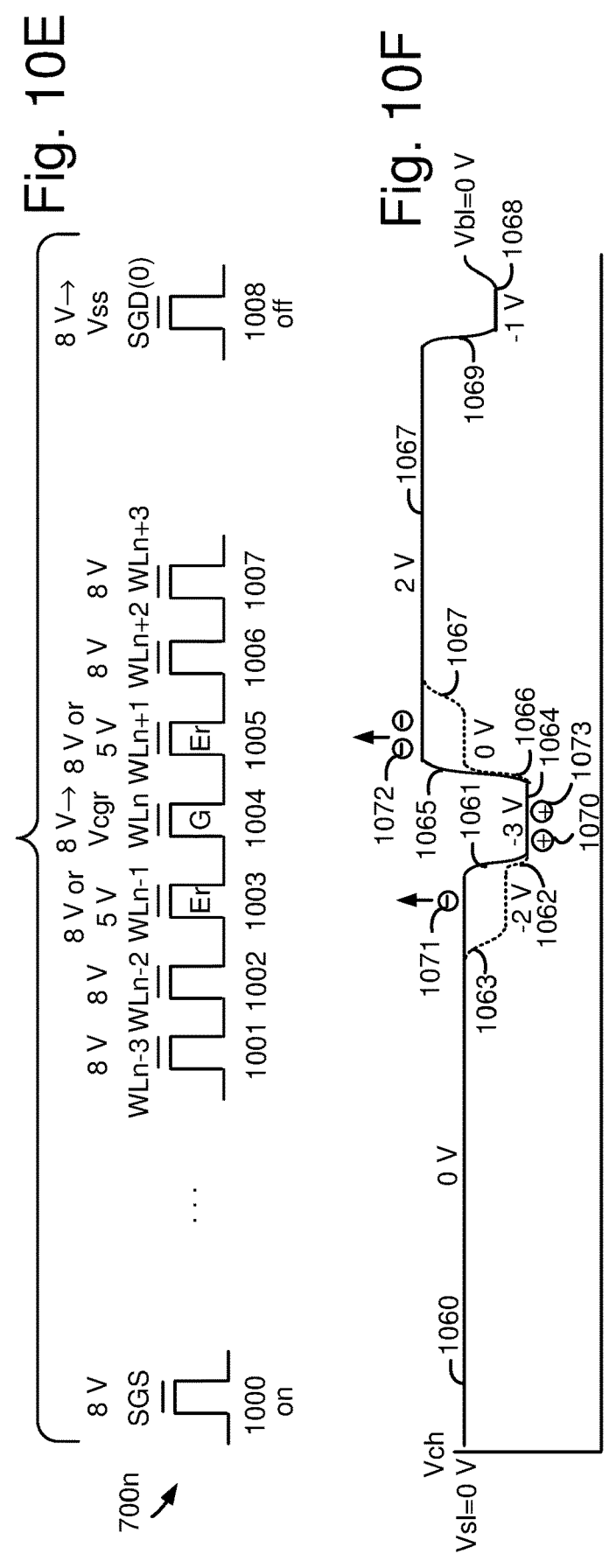

FIG. 10A depicts the NAND string 700n of FIG. 7A, at an end of a discharge period of a read operation, showing channel gradients which occur when WLn−1 and WLn+1 voltages are set at an example nominal level of 8 V and an example intermediate level of 5 V. In FIG. 10A-10F, the horizontal direction is a direction along the length of the channel of the NAND string. This may also be the vertical direction or height (z-axis) in a 3D memory structure. Refer also to FIG. 12A-12F which depict a read operation in the time period of t0-t11, including a discharge period 1205 from t0-t3 and a sensing period 1206 from t3-t10 or t3-t11. The end of the discharge period is at t3.

The NAND string includes an SGS transistor 1000 which is in the on or conductive state with 8 V applied at its control gate. Example word lines include WLn−3 to WLn+3 and associated memory cells 1001-1007, respectively. The NAND string also includes an SGD transistor 1008 which is in the off or non-conductive state when its control gate voltage decreases from 8 V to Vss. The voltage of the selected word line WLn also decreases from 8 V to Vss. In a worst case for read disturb, the associated memory cell 1004 is in the G state, the highest data state, with Vth=5 V, for instance. As the voltage on WLn decreases from 8 V to below 5 V, the memory cell 1004 transitions from a conductive state to a non-conductive state. As the voltage on WLn decreases further from 5 V to 0 V, the channel region of the memory cell 1004 transitions from 0 V to −5 V, as depicted by a plot 1024 in FIG. 10B.

FIG. 10B depicts example channel voltages in the NAND string of FIG. 10A, with and without a read disturb countermeasure. The vertical axis depicts voltage and the horizontal axis depicts a position along the NAND string of FIG.

10A. On the source-side of WLn, the channel voltage is about 0 V assuming Vsl=0 V. Further, assume the memory cell 1003 connected to WLn−1 is in the erased state. If the voltage on WLn−1 is 8 V, the associated channel voltage of, e.g., 0 V, is represented by the plot 1020 and a channel gradient of about 5 V (|0-(−5)|) is formed between WLn and WLn−1 as depicted by a plot 1021. However, if the voltage on WLn−1 is at a lower, intermediate level such as 5 V, the associated channel voltage is reduced to −2 V and a channel gradient of 3 V (|-2-(−5)|) is formed between WLn and WLn−1 as depicted by a plot 1022. Also, a channel gradient of 2 V (|0-2|) is formed between WLn−2 and WLn−1 as depicted by a plot 1023. The reduced voltage on WLn−1 helps smooth out the channel gradient on the source side of WLn so that the amount of electron-hole pairs generated by the channel gradient is reduced. Also, the reduced voltage on WLn−1 reduces the gate-to-channel electric field which draws in electrons into the charge trapping layer of the memory cell 1003. Based on these two factors, there is a reduced likelihood of injection disturb for the memory cell 1003.

The electron-hole pairs generated by the channel gradient of plot 1021 or 1022 are represented by holes, e.g., hole 1030, and electrons, e.g., electron 1031. The electrons generated by the gradients of plot 1021 and 1025 can be injected into the memory cells of WLn−1 and WLn+1, respectively, especially without the read disturb countermeasures described herein such as the use of an intermediate voltage (e.g., 5V) at the end of the discharge process. The intermediate voltage is a positive voltage that is less than the normal read pass voltage.

On the drain side of WLn, the channel voltage is about 2 V, for instance, as represented by the plot 1032. This is an example of a relatively small boosting level which is not as high as a level such as about 8 V which would be seen if the discharge process was not used. Further, assume the memory cell 1005 connected to WLn+1 is in the erased state. If the voltage on WLn+1 is 8 V, a channel gradient of 7 V (|2-(−5)|) is formed between WLn and WLn+1 as depicted by a plot 1025. However, if the voltage on WLn+1 is at an intermediate level such as 5 V, the associated channel voltage is reduced to 0 V and a channel gradient of 5 V (|0-(−5)|) is formed between WLn and WLn+1 as depicted by a plot 1026. Also, a channel gradient of 2 V is formed between WLn+1 and WLn+2 as depicted by a plot 1027. The reduced voltage on WLn+1 helps smooth out the channel gradient on the drain side of WLn so that the amount of electron-hole pairs generated by the channel gradient is reduced. Also, the reduced voltage on WLn+1 reduces the gate-to-channel electric field which draws in electrons into the charge trapping layer of the memory cell 1005. Based on these two factors, there is a reduced likelihood of injection disturb for the memory cell 1005. The electron-hole pairs generated by the channel gradient of plot 1025 or 1026 are represented by holes, e.g., hole 1033, and electrons, e.g., electron 1021.

As mentioned, the source line may have a voltage Vsl=0 V so that the portion of the channel on the source side of WLn will tend to be set at 0 V. However, due to the transient condition created when the WLn voltage decreases at the end of the discharge period, the channel voltage is pulled down to about −5 V near WLn, as mentioned. The channel voltage of −2 V near WLn−1 is depicted as an example transition voltage between 0 V and −5 V. The SGS transistor is in a conductive state so that the voltage of the portion of the channel on the source side of WLn is not floating during the discharge period.

In contrast, the voltage of the portion of the channel on the drain side of WLn begins to float at the end of the discharge period as the SGD transistor 1008 transitions to a non-conductive state. As a result, some boosting can occur, as represented by the example of 2 V at plot 1032. Specifically, assume the SGD transistor has a Vth=1 V. As the voltage on the SGD transistor decreases from 8 V to below 1 V, the SGD transistor transitions from a conductive state to a non-conductive state. As the voltage on the SGD transistor decreases further from 1 V to 0 V, the channel region of the SGD transistor transitions from 0 V to −1 V, as depicted by a plot 1028 in FIG. 10B. A channel gradient of 3 V (|2-(−1)|) is formed between the SGD transistor and the WL95 transistor as depicted by a plot 1029.

Generally, the read disturb is worse on the drain side of WLn compared to the source side because the drain side of the channel is cutoff from Vbl=0 V while the source side of the channel continues to receive Vsl=0 V, in one example. The drain side of the channel is therefore boosted to a higher level than the source side of the channel, so that the channel gradient between WLn and WLn+1 is greater than the channel gradient between WLn and WLn−1. The boosting of the drain side of the channel is due to a capacitive coupling up of the voltages of the unselected word lines.

The unselected word lines other than WLn−1 and WLn+1 can have a normal read pass voltage of, e.g., 8 V, in this example during the discharge process.

FIG. 10C depicts the NAND string 700n of FIG. 7A, at an end of a discharge period of a read operation, showing channel gradients which occur when WLn−2, WLn−1, WLn+1 and WLn+2 voltages are set at an example nominal level of 8 V and at example intermediate levels of 5 V and 6 V. The channel gradients can be smoothed out further compared to FIG. 10A by also applying an intermediate voltage to WLn−2 and WLn+2.

As the voltage on WLn decreases from 8 V to 0 V, the memory cell 1004 transitions from a conductive state to a non-conductive state and the channel region of the memory cell 1004 transitions from 0 V to −5 V, as depicted by a plot 1052 in FIG. 10D.

FIG. 10D depicts example channel voltages in the NAND string of FIG. 10C, with and without a read disturb countermeasure. The vertical axis depicts voltage and the horizontal axis depicts a position along the NAND string of FIG. 10C. If the voltage on WLn−1 is 8 V, the associated channel voltage of, e.g., 0 V, is represented by the plot 1040 and a channel gradient of 5 V is formed between WLn and WLn−1 as depicted by a plot 1041. However, if the voltage on WLn−1 is at an intermediate level such as 5 V, the associated channel voltage is reduced to −2 V and a channel gradient of 3 V is formed between WLn and WLn−1 as depicted by a plot 1042.

Furthermore, if the voltage on WLn−2 is 8 V, the associated channel voltage of, e.g., 0 V, is represented by the plot 1040 and there is no further smoothing of the channel gradient of the plot 1041. However, if the voltage on WLn−2 is at an intermediate level such as 6 V, the associated channel voltage is reduced to −1 V, for instance, so that there is further smoothing of the channel gradient of the plot 1041. In particular, a channel gradient of 1 V is formed between WLn−3 and WLn−2 as depicted by a plot 1044, and a channel gradient of 1 V is formed between WLn−2 and WLn−1 as depicted by a plot 1043.

The reduced voltages on WLn−2 and WLn−1 help smooth out the channel gradient on the source side of WLn so that the amount of electron-hole pairs generated by the channel gradient is reduced. Also, the reduced voltages on WLn−2 and WLn−1 reduce the gate-to-channel electric field which draws in electrons into the charge trapping layer of the memory cells 1002 and 1003, respectively. Based on these two factors, there is a reduced likelihood of injection disturb for the memory cells 1002 and 1003. The electron-hole pairs generated by the source-side channel gradient are represented by holes, e.g., hole 1055, and electrons, e.g., electron 1054.

Similarly, on the drain side of WLn, if the voltage on WLn+1 is 8 V, the associated channel voltage of, e.g., 2 V, is represented by the plot 1049 and a channel gradient of 7 V is formed between WLn and WLn+1 as depicted by a plot 1045. However, if the voltage on WLn+1 is at an intermediate level such as 5 V, the associated channel voltage is reduced to 0 V and a smaller channel gradient of 5 V is formed between WLn and WLn+1 as depicted by a plot 1046.

If the voltage on WLn+2 is 8 V, the associated channel voltage of, e.g., 2 V, is represented by the plot 1049 so that there is no further smoothing of the channel gradient of the plot 1041. However, if the voltage on WLn+2 is at an intermediate level such as 6 V, the associated channel voltage is reduced to −1 V and there is further smoothing of the channel gradient of the plot 1045. In particular, a channel gradient of 1 V is formed between WLn+3 and WLn+2 as depicted by a plot 1048, and a channel gradient of 1 V is formed between WLn+2 and WLn+1 as depicted by a plot 1047.

The reduced voltages on WLn+1 and WLn+2 help smooth out the channel gradient on the drain side of WLn so that the amount of electron-hole pairs generated by the channel gradient is reduced. Also, the reduced voltage on WLn+1 and WLn+2 reduces the gate-to-channel electric field which draws in electrons into the charge trapping layer of the memory cells 1005 and 1006, respectively. Based on these two factors, there is a reduced likelihood of injection disturb for the memory cells 1005 and 1005. The electron-hole pairs generated by the drain-side channel gradient are represented by holes, e.g., hole 1056, and electrons, e.g., electron 1053.

As the voltage on the SGD transistor decreases from 8 V to 0 V, the channel region of the SGD transistor transitions from 0 V to −1 V, as depicted by a plot 1050 in FIG. 10D. A channel gradient of 3 V is formed between the SGD transistor and the WL95 transistor as depicted by a plot 1051.

In this example, the intermediate voltage on WLn−2 and WLn+2 is greater than the intermediate voltage on WLn−1 and WLn+1 to provide the smoothing of the channel gradient as depicted.

FIG. 10E depicts a modification of the NAND string 700n of FIG. 10A, where the selected word line voltage is decreased from Vread to Vcgr instead of Vss to reduce the channel gradient between WLn and WLn+1 and between WLn and WLn−1, and showing channel gradients which occur when WLn−1 and WLn+1 voltages are set at an example nominal level of 8 V and an example intermediate level of 5 V. The channel gradients between WLn−1 and WLn, on the source side of WLn, and between WLn and WLn+1, on the drain side of WLn, are a function of the channel voltage adjacent to WLn at the end of the discharge period. This channel voltage in turn is a function of the amount by which the WLn voltage is decreased below the Vth of the associated memory cell. By halting the decrease of the WLn voltage at a higher level than 0 V, for example, the channel gradients can be reduced. This read disturb countermeasure can be used alone or with the read disturb countermeasure of setting the voltages of WLn−1 and WLn+1, or WLn−2, WLn−1, WLn+1 and WLn+2 to an intermediate voltage during the discharge period.

In one approach, the WLn voltage is reduced to a control gate read level, Vcgr, at the end of the discharge period. Vcgr is a voltage used during the sensing period of the read operation. If the sensing period involves sensing with multiple levels of Vcgr, the WLn voltage may be reduced to the level of the first Vcgr, in one approach. Vcgr may be a positive voltage, in one approach. In this example, the voltage of WLn decreases from 8 V to Vcgr such as 2 V. As the voltage on WLn decreases from 8 V to below 5 V, the memory cell 1004 transitions from a conductive state to a non-conductive state. As the voltage on WLn decreases further from 5 V to 2 V, the channel region of the memory cell 1004 transitions from 0 V to −3 V, as depicted by a plot 1064 in FIG. 10F. This down coupling of the channel adjacent to WLn is therefore to −3 V instead of to −5 V as in FIGS. 10B and 10D.

FIG. 10F depicts example channel voltages in the NAND string of FIG. 10E, with first and second read disturb countermeasures. The first read disturb countermeasure involves applying an intermediate voltage instead of the normal read pass voltage to one or more word lines adjacent to or otherwise close to WLn during the discharge period of a read operation. The intermediate voltage can be applied to a first group of one or more word lines and/or to a second group of one or more word lines. The first group is adjacent to WLn on the drain side of WLn and the second group is adjacent to WLn on the source side of WLn. The first group may comprise a number of successive adjacent word lines, and the second group may comprise a number of successive adjacent word lines. The second read disturb countermeasure involves decreasing the WLn voltage to Vcgr or other positive voltage instead of to 0 V at the end of the discharge period.

The vertical axis depicts voltage and the horizontal axis depicts a position along the NAND string of FIG. 10E. If the voltage on WLn−1 is 8 V, the associated channel voltage of, e.g., 0 V, is represented by the plot 1060 and a channel gradient of 3 V is formed between WLn and WLn−1 as depicted by a plot 1061. However, if the voltage on WLn−1 is at an intermediate level such as 5 V, the associated channel voltage is reduced to −2 V and a channel gradient of 1 V is formed between WLn and WLn−1 as depicted by a plot 1062. Also, a channel gradient of 2 V is formed between WLn−2 and WLn−1 as depicted by a plot 1063. Due to the reduced channel gradient of plot 1061 (3 V compared to 5 V for the plot 1021 of FIG. 10B), the amount of electron-hole pairs generated by the channel gradient is reduced so that there is a reduced likelihood of injection disturb for the memory cell 1003. The electron-hole pairs generated by the channel gradient of plot 1061 or 1062 are represented by holes, e.g., hole 1070, and electrons, e.g., electron 1071.

If the voltage on WLn+1 is normal read pass level of, e.g., 8 V, the associated channel voltage of, e.g., 2 V, is represented by the plot 1067 and a channel gradient of 5 V is formed between WLn and WLn+1 as depicted by a plot 1065. However, if the voltage on WLn+1 is at an intermediate level such as 5 V, the associated channel voltage is reduced to 0 V and a channel gradient of 3 V is formed between WLn and WLn+1 as depicted by a plot 1066. Also, a channel gradient of 2 V is formed between WLn+1 and WLn+2 as depicted by a plot 1067. Due to the reduced channel gradient of plot 1065 (5 V compared to 7 V for the plot 1025 of FIG. 10B), the amount of electron-hole pairs generated by the channel gradient is reduced so that there is a reduced likelihood of injection disturb for the memory cell

1005. The electron-hole pairs generated by the channel gradient of plot 1065 or 1067 are represented by holes, e.g., hole 1073, and electrons, e.g., electron 1072.

As the voltage on the SGD transistor decreases from 8 V to 0 V, the channel region of the SGD transistor transitions from 0 V to −1 V, as depicted by a plot 1068. A channel gradient of 3 V is formed between the SGD transistor and the WL95 transistor as depicted by a plot 1069.

The voltages depicted in FIG. 10A-10F are examples only. The channel voltage will be affected by factors such as how long the SGD transistor is in a conductive state, the timing of the increase of the word line voltages, and the timing of the decrease of the WLn voltage at the end of the discharge period.

FIG. 11 depicts a flowchart of an example read operation which reduces read disturb, consistent with FIG. 10A-10F. Step 1100 includes receiving a read command for a selected word line WLn in a selected sub-block. For example, the command could be issued by the host device 140 and received by the controller 122 in FIG. 1. Step 1101 includes determining voltages for a discharge period. This step can be responsive to step 1102 which involves considering the WLn position in the stack, the temperature, the number of read cycles, the time since the last sensing operation and/or a page type of the read operation. Step 1103 includes discharging the channels of the NAND strings in the unselected sub-blocks during a discharge period. This step can involve steps 1104 and 1105. See the example discharge period such as t0-t3 in FIG. 12A-12F.

Step 1104 includes providing a two-step increase to a read pass voltage for WLn−1 and WLn+1 and a one-step increase to a read pass voltage for the remaining unselected word lines, and for the SGD transistors of the selected sub-block. The step could be modified by providing the two-step increase for WLn+1 but not WLn−1, for example, since read disturb is more likely for the WLn+1 memory cells. The step could be also modified by providing the two-step increase for additional word lines such as WLn−2 and/or WLn+2, for example. Moreover, more than two steps could be used as well. The two step increase includes a first step from a respective initial level such as 0 V to a respective intermediate level such as 5 V and a second step from the respective intermediate level to a respective read pass voltage such as 8.5 V. Step 1105 includes, during the first step increase of the voltage for WLn−1 and WLn+1, increasing a voltage for WLn and the SGD transistors of the unselected sub-blocks from a respective initial level to a respective read pass voltage, then decreasing the voltage of WLn and the SGD transistors of the unselected sub-blocks from the respective read pass level to a respective reduced level. The reduced level could be 0 V or a control gate read level, for example.

Step 1106 includes sensing the memory cells in the selected sub-block in a sensing period. See the example sensing period such as t3-t10 or t3-t11 in FIG. 12A-12F.

Steps 1101-1106 can be performed by the circuits of FIG. 1, for example.

In FIG. 12A-12F, the vertical axis denotes voltage and the horizontal axis denotes a common time axis. A time period 1205 at t0-t3 represents a discharge period and a time period 1206 at t3-t10 (for a lower page read or an upper page read) or t3-t11 (for a middle page read) represents a sensing period.

Figure 12A:
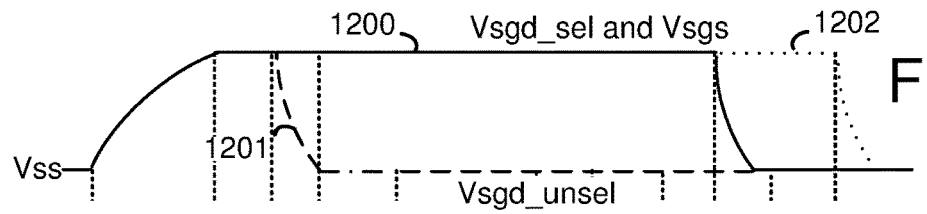
FIG. 12A depicts example voltage signals applied to select gate transistors in a read operation consistent with FIG. 11.

FIG. 12A depicts example voltage signals applied to select gate transistors in a read operation consistent with FIG. 11. Vsgd_sel is a voltage applied to the control gates of the SGD transistors in a selected sub-block of a read operation. This is the sub-block with the selected memory cells. Vsgd_unsel is a voltage applied to the control gates of the SGD transistors in unselected sub-blocks. Vsgs is a voltage applied to the control gates of the SGS transistors for both selected and unselected sub-blocks in the block, in this example. At t0, the voltages are increased or ramped up from a respective initial level Vss=0 V, for instance, to a respective peak level such as 8 V. Vsgs and Vsgd_sel are maintained at the peak level until t9 or t11 as represented by plots 1200 and 1202, respectively. Vsgd_unsel decreases, e.g., is ramped down, to the respective initial level such as 0 V from t2-t3 (plot 1201) and remains at 0 V until the end of the read operation.

When the SGD voltages are at the peak level, the SGD transistors are in a conductive state so that the bit line voltage, e.g., 0 V, is connected to the drain end of the NAND string channel. This creates a discharge path of the channel at the drain end of the NAND string. Also, when the SGS voltages are at the peak level, the SGS transistors are in a conductive state so that the source line voltage, e.g., 0 V, is connected to the source end of the NAND string channel. This creates a discharge path of the channel at the source end of the NAND string.

In the sensing period, Vsgd_sel and Vsgs remain at the peak level so that sensing of the NAND strings in the selected sub-block can occur. Vsgd_unsel is set to 0 V so that the associated SGD transistors are in a non-conductive state. This prevents the unselected NAND strings from interfering with the sensing of the selected NAND strings.

Figure 12B:
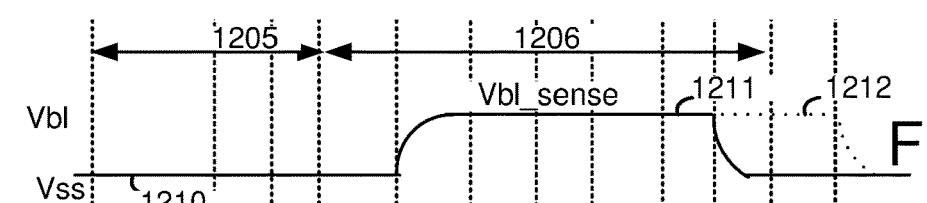
FIG. 12B depicts an example voltage signal applied to a selected bit line in a read operation consistent with FIG. 11.

FIG. 12B depicts an example voltage signal applied to a selected bit line in a read operation consistent with FIG. 11. A selected bit line is a bit line connected to a NAND string in which a memory cell is being read. Typically, all NAND strings are read concurrently although it is possible that only a subset of the NAND strings are read. As show by a plot 1210, the bit line voltage, Vbl, may be set to 0 V during the discharge period to help discharge the voltage of the NAND string channels from the drain end of the NAND strings. At t4, Vbl is increased to a sensing voltage, Vbl_sense (plot 1211 and optionally also plot 1212), as discussed in connection with FIG. 2. During sensing for each read voltage, the sense node voltage of the sense circuit may remain relatively steady or may decay. If the sense node voltage decays below a specified trip voltage, the selected memory string is considered to be in a conductive state and the Vth of the selected memory cell is below the read voltage, in one embodiment. The determination of whether the sense node voltage decays below the trip voltage is made at t6 and t8 for sensing relative to VrA and VrE, respectively, when a lower page is read consistent with FIG. 12C, or VrC and VrG, respectively, when an upper page is read consistent with FIG. 12E. The determination is made at t6, t8 and t10 for sensing relative to VrB, VrD and VrF, respectively, when a middle page is read consistent with FIG. 12D.

If the sense node voltage does not decay below the trip voltage, the selected memory string is considered to be in a non-conductive state and the Vth of the selected memory cell is equal to or above the demarcation voltage. The bit line voltage is ramped down to Vss at t9 or t11.

The source line voltage Vsl is not depicted but may be fixed at Vss=0 V in this example. Vsl is common to all NAND strings in a block, in one approach. During the discharge period, setting Vsl=0 V helps to discharge the voltage of the NAND string channels from the source end of the NAND strings. During the read period, setting Vsl=0 V allows a current to flow from the drain end to the source end since Vbl_sense>Vsl.

Figure 12C:
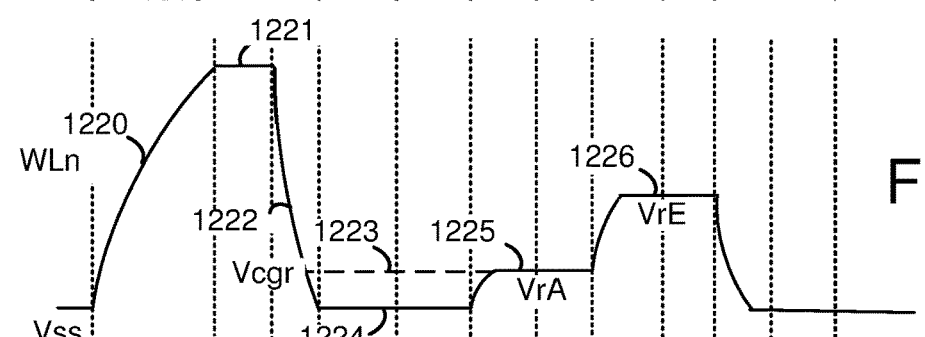
FIG. 12C depicts an example voltage signal applied to a selected word line, WLn, in a read operation consistent with FIG. 11, where a lower page of data is read.

FIG. 12C depicts an example voltage signal applied to a selected word line, WLn, in a read operation consistent with FIG. 11, where a lower page of data is read. At the start of the discharge period, at to, the WLn voltage is increased (plot 1220) from a respective initial level of Vss to a respective peak level such as a read pass voltage (plot 1221). The WLn voltage may be stabilized and maintained at the peak level for a period of time such as t1-t2, in one option. In another option, the WLn voltage is decreased before it stabilizes at a peak level. The voltage comprises a spike shape since it increases and then decreases relatively quickly. There is an increase and then a decrease a voltage of the selected word line layer. By providing the selected word line voltage at a sufficiently high level (a turn-on voltage), the associated memory cells are provided in a conductive state to increase the channel discharge.

At the end of the discharge period, the WLn voltage decreases (plot 1222) from the respective peak level to a reduced level in the time period t2-t3. Plot 1224 shows the reduced level being 0 V, and plot 1223 shows the reduced level being a control gate read voltage Vcgr=VrA. VrA is the first, and lowest, control gate read voltage of the read operation for the lower page. As mentioned in connection with FIGS. 10E and 10F, read disturb can be reduced by reducing the amount by which the WLn+1 or WLn−1 voltage exceeds the WLn voltage at the end of the discharge period. Thus, read disturb can be reduced by decreasing the WLn+1 or WLn−1 voltage and/or increasing the WLn voltage at the end of the discharge period. The unselected word line voltages including the WLn+1 or WLn−1 voltage should not be decreased too much, but should generally be sufficiently high to provide the associated memory cells in a conductive state to allow the channel discharge to occur. If the unselected word line voltages are too low in the discharge period, a portion of the channel could be cutoff, reducing the channel discharge. In an example in which the Vth of the highest data state is 5 V, the unselected word line voltages should be about 5 V or higher.

During the sensing period, the WLn voltage of plot 1224 is increased to VrA (plot 1225) at t5 and from VrA to VrE (plot 1226) at t7, and is decreased from VrE to 0 V at t9. The WLn voltage of plot 1223 is maintained at VrA and then increased from VrA to VrE.

Figure 12D:
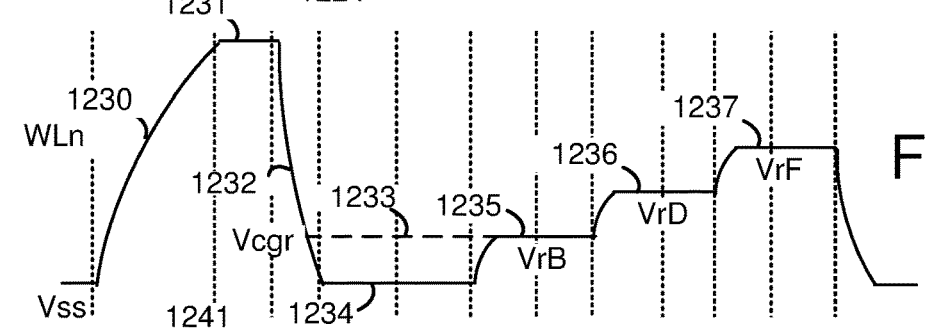
FIG. 12D depicts an example voltage signal applied to a selected word line, WLn, in a read operation consistent with FIG. 11, where a middle page of data is read.

FIG. 12D depicts an example voltage signal applied to a selected word line, WLn, in a read operation consistent with FIG. 11, where a middle page of data is read. A read of the middle page involves reading with control gate voltages of VrB, VrD and VrF for the example case of eight data states. At the start of the discharge period, at to, the WLn voltage is increased (plot 1230) from a respective initial level of Vss to a respective peak level such as a read pass voltage (plot 1231). At the end of the discharge period, the WLn voltage decreases (plot 1232) from the respective peak level to a reduced level in the time period t2-t3. Plot 1234 shows the reduced level being 0 V, and plot 1233 shows the reduced level being Vcgr=VrB. VrB is the first, and lowest, control gate read voltage of the read operation for the middle page.

During the sensing period, the WLn voltage of plot 1234 is increased to VrB (plot 1235) at t5, from VrB to VrD (plot 1236) at t7, and from VrD to VrF (plot 1237) at t9, and is decreased from VrF to 0 V at t11. The WLn voltage of plot 1233 is maintained at VrB and then increased from VrB to VrD, and from VrD to VrF.

Figure 12E:
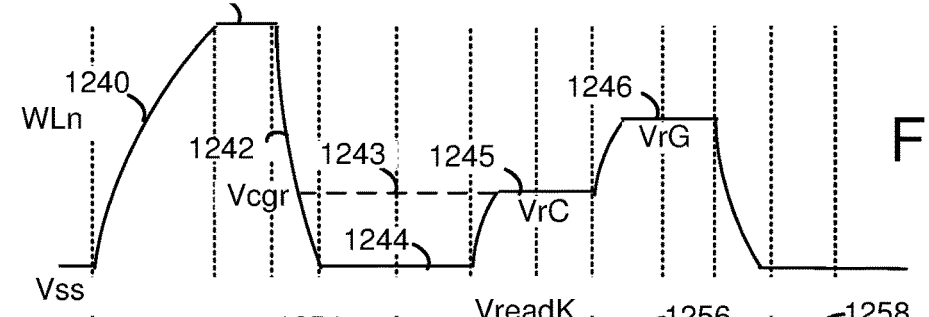
FIG. 12E depicts an example voltage signal applied to a selected word line, WLn, in a read operation consistent with FIG. 11, where an upper page of data is read.

FIG. 12E depicts an example voltage signal applied to a selected word line, WLn, in a read operation consistent with FIG. 11, where an upper page of data is read. A read of the upper page involves reading with control gate voltages of VrC and VrG for the example case of eight data states. At the start of the discharge period, at t0, the WLn voltage is increased (plot 1240) from a respective initial level of Vss to a respective peak level such as a read pass voltage (plot 1241). At the end of the discharge period, the WLn voltage decreases (plot 1242) from the respective peak level to a reduced level in the time period t2-t3. Plot 1244 shows the reduced level being 0 V, and plot 1243 shows the reduced level being Vcgr=VrC. VrC is the first, and lowest, control gate read voltage of the read operation for the upper page.

During the sensing period, the WLn voltage of plot 1244 is increased to VrC (plot 1245) at t5, and from VrC to VrG (plot 1246) at t7, and is decreased from VrG to 0 V at t9. The WLn voltage of plot 1243 is maintained at VrC and then increased from VrC to VrG.

As depicted, the reduced level of the WLn voltage at the end of the discharge period could be 0 V or a positive voltage such as a control gate read voltage. It is also possible for the reduced level of the WLn voltage to be a positive voltage which is lower than or higher than a control gate read voltage. If the WLn voltage at the end of the discharge period is lower than the first control gate read voltage, the WLn voltage is increased to the first control gate read voltage at t5. If the WLn voltage at the end of the discharge period is higher than the first control gate read voltage, the WLn voltage is decreased to the first control gate read voltage at t5.

Figure 12F:
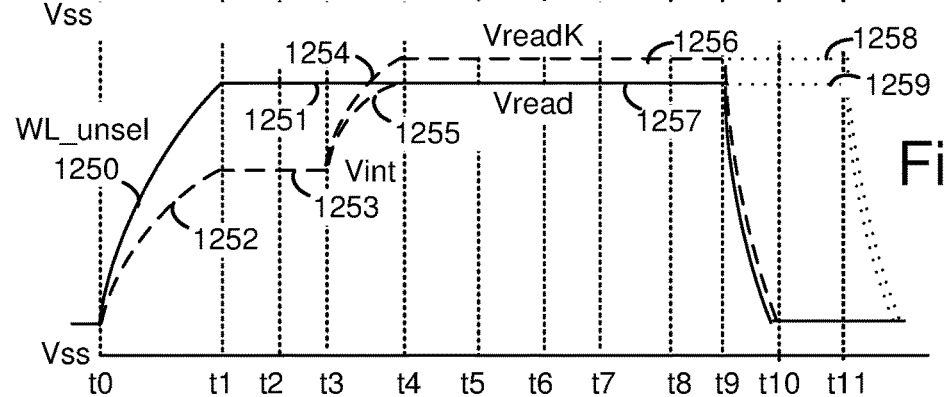
FIG. 12F depicts an example voltage signal applied to unselected word lines, WL_unsel, in a read operation consistent with FIG. 11 and FIG. 12A-12E.

FIG. 12F depicts an example voltage signal applied to unselected word lines, WL_unsel, in a read operation consistent with FIG. 11 and FIG. 12A-12E. The unselected word line voltages can increase in one or two steps as mentioned. Plot 1250 shows a one-step increase at t0-t1 from a respective initial level of 0 V to a respective peak level (plot 1251) of Vread, e.g., 8 V. Plot 1252 shows a first step increase at t0-t1 from a respective initial level of 0 V to a respective intermediate level (plot 1253) of Vint, e.g., 5-6 V. Vint may be maintained from t1-t3 and, in particular, from t2-t3 when the WLn voltage is decreasing. Recall that by applying Vint instead of Vread during the decrease of the WLn voltage at the end of the discharge period, read disturb is reduced. Plot 1254 shows a second step increase at t3-t4 from Vint to VreadK, e.g., 8.5 V. VreadK is slightly higher than Vread, e.g., by 0.5-1 V, and may be used on WLn−1 and WLn+1, for instance. Using a slightly higher read pass voltage on WLn−1 and WLn+1 during sensing can reduce read disturb since it ensures that the NAND string channel is strongly conductive. In particular, the higher read pass voltage compensates for parasitic charges which can be formed between WLn and its adjacent word lines. The read pass voltage of a word line should not be too high or it can cause inadvertent programming of the associated memory cells.

In another option, plot 1255 shows a second step increase at t3-t4 from Vint to the normal read pass level of Vread. Vread may be applied to all of the unselected data word lines except WLn−1 and WLn+1, or except WLn−2, WLn−1, WLn+1 and WLn+2, for example. During a lower or upper page read, VreadK or Vread is maintained until t9 (plot 1256 or 1257, respectively), then decreased to the respective initial level of 0 V. During a middle page read, VreadK or Vread is maintained until t11 (plot 1258 or 1259, respectively), then decreased to 0 V.

FIG. 13A depicts a first example of word line voltages during a discharge period and a sensing period of a read operation, consistent with FIG. 11. In FIG. 13A-13D, a first column identifies word lines, a second column identifies a voltage applied to the word lines during the discharge period, including during the decrease of the WLn voltage at the end of the discharge period, and a third column identifies a voltage applied to the word lines during the sensing period. In this example, the two-step increase is used for WLn−1 and WLn+1. A one-step increase is used for the remaining unselected word lines, e.g., WL0 to WLn−2 and WLn+2 to WL95, consistent with FIG. 7A. In this example, the stack can include one or more tiers.

For WL0 to WLn−2 and WLn+2 to WL95, Vread is applied during the discharge period and during the sensing period. For WLn−1 and WLn+1, Vint is applied during the discharge period and VreadK is applied during the sensing period. Note that VreadK>Vread>Vint>0 V.

FIG. 13B depicts a second example of word line voltages during a discharge period and a sensing period of a read operation, consistent with FIG. 11. In this example, the two-step increase is used for WLn−2, WLn−1, WLn+1 and WLn+2. WLn−2 is an unselected word line which is adjacent to WLn−1 and WLn+2 is an unselected word line which is adjacent to WLn+1. A one-step increase is used for the remaining unselected word lines, e.g., WL0 to WLn−3 and WLn+3 to WL95, consistent with FIG. 7A. In this example, the stack can include one or more tiers.

For WL0 to WLn−3 and WLn+3 to WL95, Vread is applied during the discharge period and during the sensing period. For WLn−2 and WLn+2, Vint is applied during the discharge period and Vread is applied during the sensing period. For WLn−1 and WLn+1, Vint is applied during the discharge period and VreadK is applied during the sensing period. Note that Vint can be the same or different for WLn−2 and WLn+2 versus WLn−1 and WLn+1. In one approach, consistent with FIG. 10C, Vint is higher for WLn−2 and WLn+2 (e.g., 6 V) than for WLn−1 and WLn+1 (e.g., 5 V).

FIG. 13C depicts a third example of word line voltages during a discharge period and a sensing period of a read operation, consistent with FIG. 11, for the lower tier of a multi-tier stack. See also FIGS. 15A and 15B. In one approach, read disturb is not problematic for WLn−1 in the lower tier of a multi-tier stack so that a one-step increase can be used for the voltage of WLn−1 while a two-step increase is used for the voltage of WLn+1. A two-step increase can be used for WLn−1 such as depicted in FIG. 13A when WLn−1 is in the upper tier of a multi-tier stack or in a single tier stack.

For WL0 to WLn−2 and WLn+2 to WL95, Vread is applied during the discharge period and during the sensing period. For WLn−1, VreadK is applied during the discharge period and during the sensing period. For WLn+1, Vint is applied during the discharge period and VreadK is applied during the sensing period.

FIG. 13D depicts a fourth example of word line voltages during a discharge period and a sensing period of a read operation, consistent with FIG. 11, for the lower tier of a multi-tier stack. See also FIGS. 15A and 15B. In one approach, read disturb is not problematic for WLn−2 and WLn−1 in the lower tier of a multi-tier stack so that a one-step increase can be used for the voltage of WLn−2 and WLn−1 while a two-step increase is used for the voltage of WLn+1 and WLn+2. A two-step increase can be used for WLn−2 and WLn−1 such as depicted in FIG. 13B when WLn−2 and WLn−1 are in the upper tier of a multi-tier stack or in a single tier stack.

For WL0 to WLn−3 and WLn+3 to WL95, Vread is applied during the discharge period and during the sensing period. For WLn−2, Vread is applied during the discharge period and during the sensing period. For WLn−1, VreadK is applied during the discharge period and during the sensing period. For WLn+1, Vint is applied during the discharge period and VreadK is applied during the sensing period. For WLn+2, Vint is applied during the discharge period and Vread is applied during the sensing period.

Figure 14A:
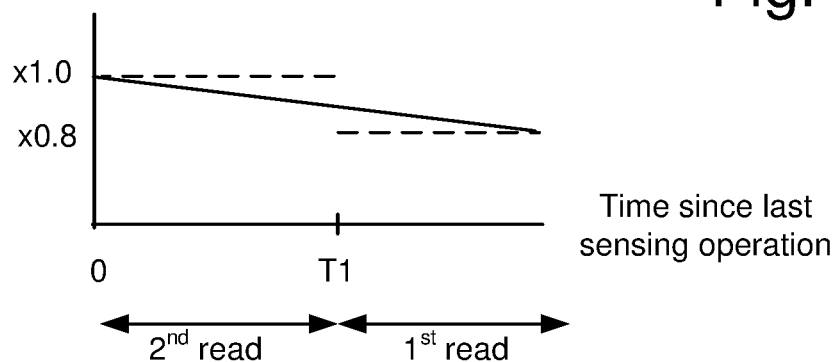
FIG. 14A depicts an example plot of an adjustment to the intermediate voltage, Vint, of FIG. 12F versus a time since a last sensing operation, consistent with FIG. 17A-17D and step 1102 of FIG. 11.
Figure 14B:
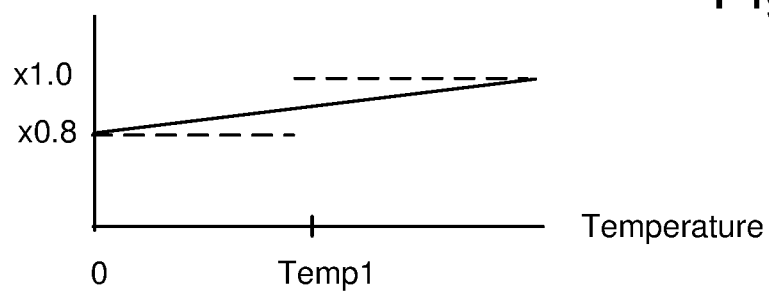
FIG. 14B depicts an example plot of an adjustment to the intermediate voltage, Vint, of FIG. 12F versus a temperature from the temperature-sensing circuit 117 of FIG. 1A, consistent with step 1102 of FIG. 11.
Figure 14C:
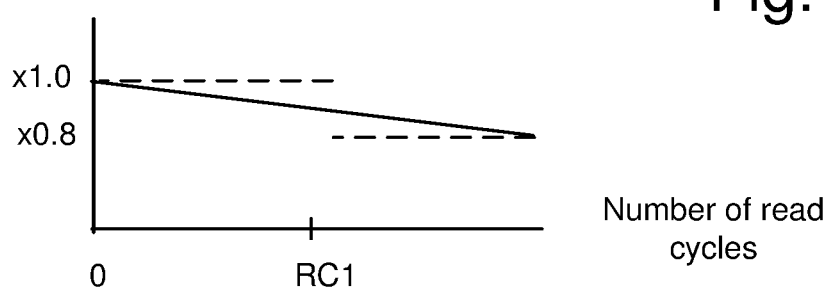
FIG. 14C depicts an example plot of an adjustment to the intermediate voltage, Vint, of FIG. 12F versus a number of read cycles from the read cycle-tracking circuit 121 of FIG. 1A, consistent with FIG. 9B and with step 1102 of FIG. 11.

FIG. 14A depicts an example plot of an adjustment to the intermediate voltage, Vint, of FIG. 12F versus a time since a last sensing operation, consistent with FIG. 17A-17D and step 1102 of FIG. 11. In FIG. 14A-14C, the vertical axis depicts an adjustment to Vint in terms of a multiplier such as ×1.0 (no adjustment) or ×0.8 (a reduction of 20%). As mentioned, and as described further in connection with FIG. 17A-17D, the channel voltage can be coupled up after a sensing operation and gradually decay over time. Moreover, it has been observed that the injection type of read disturb is relatively greater when the elapsed time since the last sensing operation is relatively long.

For example, FIG. 14A depicts a first read state in which memory cells are read after a relatively long time period since last sensing operation, and a second read state in which memory cells are read after a relatively short time period since last sensing operation. When the memory cells are read while in the first read state, the channel voltage of the memory cells is at a relatively low voltage such as 0 V when the voltages of the unselected word lines are ramped up from 0 V to the read pass voltage, e.g., 8 V. The channel voltage to be discharged is based on the amount by which the voltages of the unselected word lines exceeds the channel voltage (e.g., 8−0=8 V) which is relatively large, resulting in a relatively large channel gradient and therefore a relatively large amount of read disturb.

In contrast, when the memory cells are read while in the second read state, the channel voltage of the memory cells is at a relatively high voltage such as 4 V when the voltages of the unselected word lines are ramped up from 0 V to the read pass voltage, e.g., 8 V. The channel voltage to be discharged is based on the amount by which the voltages of the unselected word lines exceeds the channel voltage (e.g., 8−4=4 V) which is relatively small, resulting in a relatively small channel gradient and therefore a relatively small amount of read disturb.

Accordingly, the elapsed time since the last sensing operation provides an indication of the likelihood of read disturb, which is greater when the time since the last sensing operation is greater. The time can be tracked using the timer 119 of FIG. 1.

In one approach, represented by the solid line, the adjustment increases from ×0.8 to ×1.0 as the time decreases. In another approach, represented by the dashed lines, ×0.8 is used when the time is greater than a threshold time of T1, and ×1.0 is used when the time is less than T1.

FIG. 14B depicts an example plot of an adjustment to the intermediate voltage, Vint, of FIG. 12F versus a temperature from the temperature-sensing circuit 117 of FIG. 1A, consistent with step 1102 of FIG. 11. Read disturb may be worse when the ambient temperature of the memory device is lower. At lower temperatures, electrons encounter fewer scattering events when flowing in the channel due to phonon scattering, which is proportional to temperature. Therefore, the electrons may keep a higher velocity and have a higher probability os being injected into the memory cells.

In one approach, represented by the solid line, the adjustment increases from ×0.8 to ×1.0 as the temperature increases. In another approach, represented by the dashed lines, ×0.8 is used when the temperature is less than a threshold temperature of Temp1, and ×1.0 is used when the temperature is more than Temp1. Reducing Vint helps reduce read disturb since it reduces the channel gradient.

Vint can be reduced when appropriate to combat the increased likelihood of program disturb. At other times, Vint can be set to a higher nominal level to optimize the channel discharge.

FIG. 14C depicts an example plot of an adjustment to the intermediate voltage, Vint, of FIG. 12F versus a number of read cycles from the read cycle-tracking circuit 121 of FIG. 1A, consistent with FIG. 9B and with step 1102 of FIG. 11. As discussed in connection with FIG. 9B, the likelihood of read disturb and the resulting read errors increases with the number of read cycles. To combat the increased likelihood of program disturb, in one approach, represented by the solid line, the adjustment decreases from ×1.0 to ×0.8 as the number of read cycles increases. In another approach, represented by the dashed lines, ×1.0 is used when the number of read cycles is less than a threshold number of read cycles of RC1, and ×1.0 is used when the number of read cycles is more than RC1.

FIG. 15A depicts a plot of a Vth width versus WLn for an unselected sub-block with lower and upper tiers, for use in step 1102 of FIG. 11. In this example, the horizontal axis depicts a position of the selected word line, WLn, which can range from WL0-WL47 in the lower tier and from WL48-WL95 in the upper tier. The horizontal axis also represents the height of WLn and the selected memory cells in the stack. Typically, the Vth width increases as the upper tail of a Vth distribution increases due to read disturb, as depicted in FIG. 9A.

For each value of WLn, a read stress was applied by performing hundreds of repeated read operations on the memory cells connected to WLn in the unselected sub-block. The memory cells connected to WLn−1 and WLn+1 were then read in the unselected sub-block with a high accuracy to obtain a Vth distribution and a corresponding Vth width (+/−2.5 sigma width). When WLn is in the lower tier, plots 1300 and 1301 depict the Vth width for the memory cells connected to WLn−1 and WLn+1, respectively. The Vth width, and the read disturb, is significantly greater for WLn+1 than for WLn−1, consistent with FIG. 10A-10F. Moreover, in plot 1301, the Vth width increases from a low value at WL0 to a peak value at about halfway through the lower tier, e.g., at WL24, and then decreases again at the top word line of the lower tier. The Vth width at the top of the lower tier is higher than the Vth width at the bottom of the lower tier. In plot 1300, the Vth width remains at a low value.

When WLn is in the upper tier, plots 1302 and 1303 depict the Vth width for the memory cells connected to WLn−1 and WLn+1, respectively. As in the lower tier, the Vth width, and the read disturb, is significantly greater for WLn+1 than for WLn−1. Moreover, the Vth width, and the read disturb, is greater for WLn−1 in the upper tier compared to the lower tier. In plot 1302, the Vth width increases from a low value at WL48 to a peak value partway between the bottom and top of the upper tier, and then decreases again back to a low value at the top of the upper tier. In plot 1303, the Vth width decreases from a peak value at the bottom of the upper tier to a lower value at about one-third the way from the bottom of the upper tier. The Vth width at the top of the upper tier is lower than the Vth width at the bottom of the upper tier.

Figure 15B:
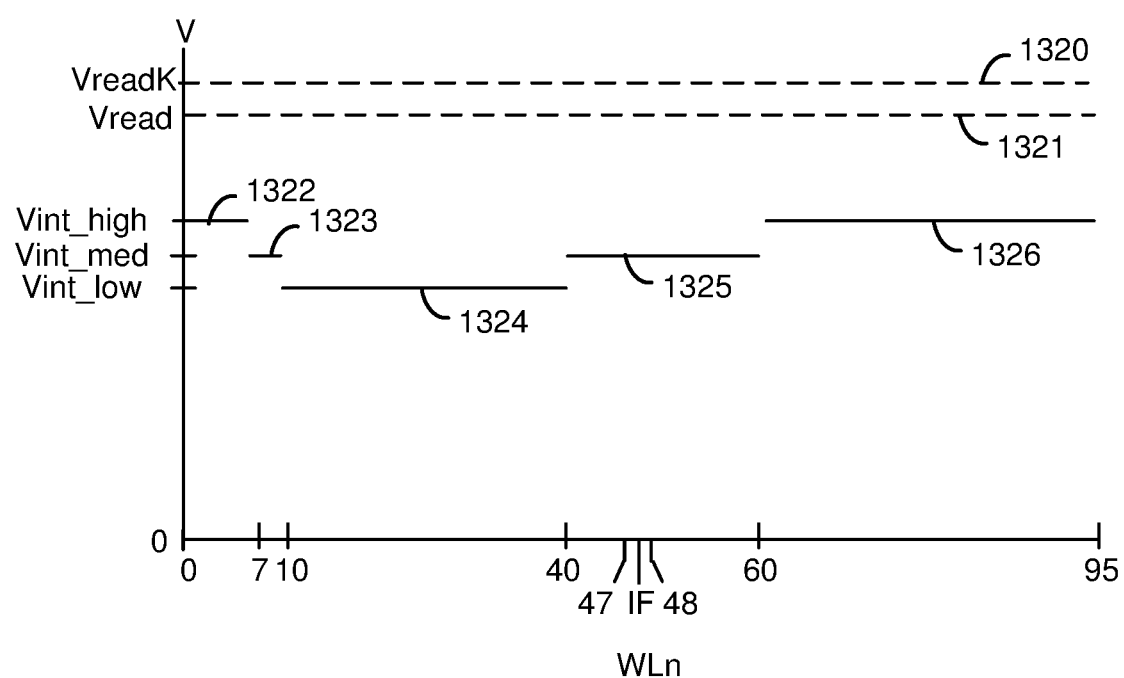
FIG. 15B depicts a plot of adjustments to the word line voltages in a discharge process, consistent with step 1102 of FIG. 11 and with FIGS. 12F and 15A.

FIG. 15B depicts a plot of adjustments to the word line voltages in a discharge process, consistent with step 1102 of FIG. 11 and with FIGS. 12F and 15A. Based on FIG. 15A, which shows the likelihood of read disturb as a function of a position of WLn in the stack, e.g., whether WLn is in the lower or upper tier, or the position of WLn within a tier, the read disturb countermeasure can be adjusted by lowering Vint when the likelihood of read disturb is greater. Lowering Vint reduces a channel gradient and the likelihood of read disturb, as discussed. The vertical axis depicts an unselected word line voltage in the discharge period and the horizontal axis depicts the position of WLn within a stack, consistent with the horizontal axis of FIG. 15A.

Since FIG. 15A shows the likelihood of read disturb increasing, reaching a peak, and then decreasing as WLn increases from the bottom to the top of the lower tier, Vint can be decreased and then increased as WLn increases from the bottom to the top of the lower tier. In this example, the word lines of the lower tier are arranged in groups which include WL0-WL6, WL7-WL9, WL10-WL39 and WL40-WL47, and the word lines of the upper tier are arranged in groups which include WL48-WL59 and WL60-WL95. For the word lines subject to a two-step increase during the discharge period, Vint is set to a high level of Vint_high, e.g., 6 V, when WLn is in the group WL0-WL6 (plot 1322) or WL60-WL95 (plot 1326), a medium level of Vint_med, e.g., 5.5 V, when WLn is in the group WL7-WL9 (plot 1323), WL40-WL47 (plot 1325) or WL48-WL59 (plot 1325), or a low level of Vint_low, e.g., 5 V, when WLn is in the group WL10-WL39 (plot 1324). This is an example, as other groupings can be used. The number of groups can also vary.

For the word lines subject to a one-step increase during the discharge period, the unselected word line voltage is set to Vread (plot 1321) or VreadK (plot 1320).

In one approach, an apparatus for implementing FIG. 15B comprises: a set of NAND strings extending vertically in a stack, the NAND strings comprise memory cells, the stack comprises a lower tier, an interface above the lower tier, an upper tier above the interface, and alternating word line layers and dielectric layers in the lower tier and the upper tier; and a control circuit. The control circuit, to perform a read operation for a selected word line layer of the stack, is configured to: (1) increase and then decrease a voltage of the selected word line layer to discharge channels of the NAND strings, before setting the voltage of the selected word line layer at a control gate read level; (2) sense memory cells connected to the selected word line layer while the voltage of the selected word line layer is set at the control gate read level; and (3) provide a voltage of a source-side adjacent word line layer of the selected word line layer at a read pass level during the sensing of the memory cells connected to the selected word line layer, wherein, during the decrease of the voltage of the selected word line layer, the control circuit is configured to provide the voltage of the source-side adjacent word line layer at a read pass level when the selected word line layer is in the lower tier and at an intermediate level which is below the read pass level and above 0 V when the selected word line layer is in the upper tier.

In one option, during the decrease of the voltage of the selected word line layer, the control circuit is configured to provide a voltage of a drain-side adjacent word line layer (WLn+1) of the selected word line layer (WLn) at a first intermediate level (e.g., 5 or 5.5 V) which is below the read pass level and above 0 V when the selected word line layer is in the lower tier and at a second intermediate level (e.g., 6 V) which is below the read pass level and above the first intermediate level when the selected word line layer is in the upper tier. The lower intermediate level is used for WLn+1 in the lower tier because the likelihood of read disturb is greater than in the upper tier for WLn+1.

The control circuit may be configured to provide the voltage of the drain-side adjacent word line layer at the read pass level during the sensing of the memory cells connected to the selected word line layer.

Also, the control circuit may be configured to set the second intermediate level to a lower level (e.g., 5V at plot 1324) when the selected word line layer is halfway between a top and a bottom of the lower tier than when the selected word line layer is at a bottom of the lower tier (e.g., 6 V at plot 1322) or at a top of the lower tier (e.g., 5V at plot 1326).

Figure 16A:
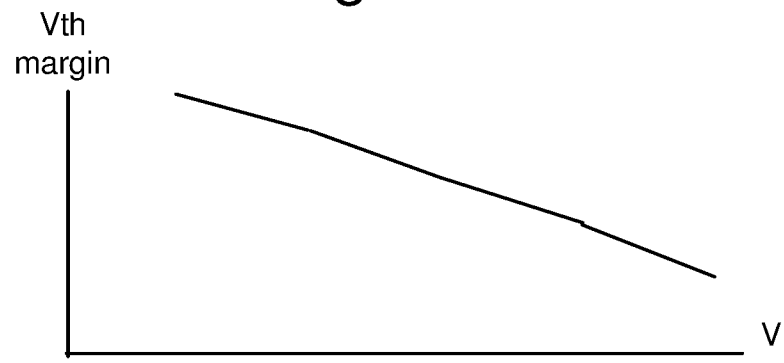
FIG. 16A depicts a plot of Vth margin versus different values of Vread on WLn+1 in a discharge process consistent with step 1103 of FIG. 11.

FIG. 16A depicts a plot of Vth margin versus different values of Vread on WLn+1 in a discharge process consistent with step 1103 of FIG. 11. The Vth margin is for the memory cells of WLn+1 and is a measure of the spacing between the Vth distributions of different data states. A greater Vth margin is better since it results in fewer read errors. As Vread is lowered, the Vth margin increases. This demonstrates the effectiveness of the read disturb countermeasures described herein.

As mentioned, the read pass voltage of a word line should not be too low or it can cutoff the channel and reduce the amount of channel discharge.

Figure 16B:
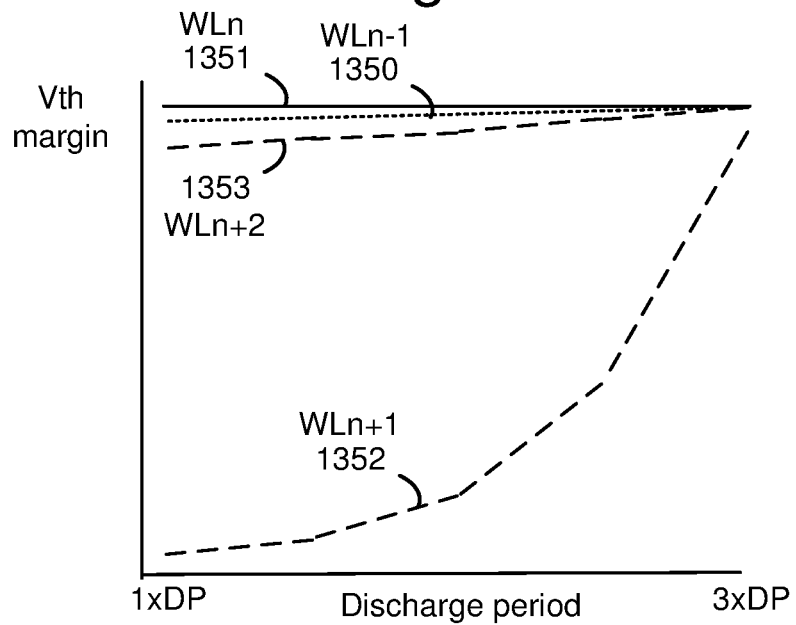
FIG. 16B depicts a plot of Vth margin versus a discharge period consistent with step 1103 of FIG. 11, for WLn−1, WLn, WLn+1 and WLn+2.

FIG. 16B depicts a plot of Vth margin versus a discharge period consistent with step 1103 of FIG. 11, for WLn−1, WLn, WLn+1 and WLn+2. Plots 1350, 1351, 1352 and 1353 represent the Vth margin for WLn−1, WLn, WLn+1 and WLn+2, respectively, for different values of the discharge period (DP). As the discharge period increases by a factor of three, e.g., from 1×DP to 3×DP, the Vth margin increases, particularly for WLn+1. The discharge period could be therefore increased to increase the amount of channel discharge and thereby reduce the channel gradients and the likelihood of a read disturb. This in turn would increase the Vth margin. However, this results in a performance penalty. The read disturb countermeasures described herein provide an alternative way to increase the Vth margin while avoiding the performance penalty of increasing in the discharge period. Although, both techniques could be combined as well.

FIG. 17A depicts a plot of example waveforms in a program operation, showing coupling up of a word line voltage. As mentioned, e.g., in connection with FIG. 14A, a NAND string channel can be coupled up after a sensing operation which could be a verify operation during programming or a read operation. Moreover, the coupled up state can be maintained for a relatively long time. Accordingly, it is useful is the discharge process of the read operation is adjusted to account for the degree of coupling up in the channel.

The coupling up can occur for data and dummy word lines after a sensing operation which occurs, e.g., as part of a program or read operation. The coupling up can be up to about 4 V, for instance. The coupling up occurs while the word line voltages are floating. FIGS. 17A and 17B describe the coupling up which occurs after the verify portion of a program operation and FIGS. 17C and 17D describe the coupling up which occurs after a read operation.

The time period shown represents one program-verify iteration or loop. The horizontal axis depicts time and the vertical axis depicts word line voltage, Vwl. A program voltage 1400 is applied to a selected word line from t0-t4 and reaches a magnitude of Vpgm. The program voltage can temporarily pause at an intermediate level such as Vpass to avoid a single large transition which can have undesired coupling effects. A pass voltage 1405 is applied to the unselected word lines from t0-t19 and reaches a magnitude of Vpass, which is sufficiently high to provide the memory cells in a conductive state so that the sensing (e.g., verify) operations can occur for the memory cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1410 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG to 0 V or other steady state level from t15-t16.

For the unselected word lines, including the dummy word lines, the decrease in Vpass will cause the memory cells to transition from a conductive state to a non-conductive state. In particular, when the Vpass falls below a cutoff level, Vcutoff (the dotted line at t18), the channel of the memory cell will become cutoff, e.g., the memory cell will become non-conductive. When a cell becomes non-conductive, it acts as a capacitor in which the control gate is one plate and the channel is another plate. A cell becomes non-conductive when Vcg<Vcutoff or Vcg<(Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a cell in the highest programmed state, e.g., the G state, the Vth can be as low as VvG and as high as the Vth at the upper tail of the G state in the Vth distribution 917 in FIG. 9A. Vcutoff can therefore be as low as VvG+Vsl or as high as Vth of the G state upper tail+Vsl. As the pass voltage 1405 decreases from Vcutoff to 0 V, the channel is capacitively coupled down by a similar amount, as represented by plot 1415 in FIG. 17B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1412 represents one example of the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds. This example assumes the word line voltage has reached its intended minimum ramped down level of Vss=0 V, for instance. When Vwl is subsequently coupled up, it reaches a maximum level of Vwl_coupled_up and the block is in the second read situation. Vwl gradually discharges back to 0 V over a period of several minutes to return the block to the first read situation.

FIG. 17B depicts a plot of a channel voltage (Vch) corresponding to FIG. 17A. Vch for an unselected NAND string (a string not having a cell which is programmed in the current program loop), will be boosted to a level such as 8 V (not shown) during the program voltage, e.g., from t0-t4. This boosting is achieved by providing the SGD and SGS transistors of the unselected string in a non-conductive state to cause Vch to float. Vch is coupled higher due to capacitive coupling when Vpass and Vpgm are applied to the word lines. For a selected NAND string (a string having a cell which is programmed in the current program loop), Vch is typically grounded as shown during the program voltage.

During the verify voltages, Vch may be initially at about 1 V, for instance, for a selected NAND string. Vch is about the same as Vsl for the channels of the selected NAND strings. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1412) are capacitively coupled higher by the increase in Vch. In one example, the voltages of the word lines float to a peak level of Vwl_coupled_up (plot 1412), e.g., about 4 V. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1-6×0.9=−4.4 V, for instance. Accordingly, as Vch returns to 0 V, there is a 4.4 V increase in Vch which is coupled to the word line, e.g., control gate, of the memory cells. By applying the 90% coupling ratio to this coupling up, Vwl_coupled_up may be about 4.4×0.9=4 V. The voltages of the word lines are floated by disconnecting the word lines from a word line driver.

The channel voltage of plot 1415 correspond to the word line voltages of plots 1412 after t19.

FIG. 17C depicts a plot of example waveforms in a read operation, showing coupling up of a word line voltage. For simplicity, the discharge process is not depicted in this example. A read operation is similar to a verify operation as both are sensing operations and both can provide a coupling up of the word line voltages. The horizontal axis depicts time and the vertical axis depicts word line voltage, Vwl. Read pass voltages of plots 1430, 1431 and 1432 are applied to the unselected word lines from t043, t4-t8 and t9-t12, respectively, and have a magnitude of Vpass. The read pass voltage includes an increasing portion, a portion at Vpass and a decreasing portion. A read voltage includes separate waveforms 1420 (at levels of VrA and VrE), 1421 (at levels of VrB, VrD and VrF) and 1422 (at levels of VrC and VrG) for each of the lower, middle and upper pages, respectively, consistent with FIG. 10. The control gate read voltages are applied to the selected word line. An eight-level memory device is used in this example.

For the unselected word lines, the decrease in Vread will cause the memory cells to transition from a conductive state to a non-conductive state, as discussed. The dotted line at t13 indicates when a G state cell becomes non-conductive. As the pass voltage of plot 1432 decreases from Vcutoff to 0 V, the channel is capacitively coupled down by a similar amount, as represented by the plot 1435 in FIG. 17D. As the channel voltage increases after t14, the word line voltages are floated and are coupled higher, to Vwl_coupled_up.

FIG. 17D depicts a plot of a channel voltage (Vch) corresponding to FIG. 17C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1432) are capacitively coupled higher by the increase in Vch (plot 1435). The voltages of the word lines float to a peak level of Vwl_coupled_up, as discussed in connection with FIG. 17B.

In one implementation, an apparatus comprises: a plurality of memory cells arranged in NAND strings; a set of word lines connected to the plurality of memory cells; and a control circuit configured to, in response to a read command involving memory cells connected to a selected word line of the set of word lines, discharge channels of the NAND strings and, after the discharge of the channels, sense the memory cells connected to the selected word line. Further, to discharge the channels, the control circuit is configured to increase a voltage of the selected word line from a respective initial level (e.g., 0 V) to a respective peak level and (e.g., Vread) then decrease the voltage of the selected word line, the decrease is from the respective peak level to a reduced level (e.g., 0 V or Vcgr), and increase a voltage of a drain-side adjacent word line of the selected word line from a respective initial level (e.g., 0 V) to a respective intermediate level (Vint, Vint_low, Vint_med, Vint_high) and maintain the voltage of the drain-side adjacent word line at its respective intermediate level during the decrease of the voltage of the selected word line; and to sense the memory cells connected to the selected word line, the control circuit is configured to increase the voltage of the drain-side adjacent word line from its respective intermediate level to a respective peak level (e.g., Vread, VreadK), and sense the memory cells connected to the selected word line while the voltage of the drain-side adjacent word line is at its respective peak level and the voltage of the selected word line is at a control gate read level.

In another implementation, a method comprises: in response to a read command involving a selected word line connected to a set of NAND strings, discharging channels of the NAND strings then sensing memory cells connected to the selected word line. The discharging of the channels of the NAND strings comprises: increasing a voltage of the selected word line from a respective initial level to a respective peak level; decreasing the voltage of the selected word line from the respective peak level to a reduced level; increasing a voltage of an adjacent word line of the selected word line from a respective initial level to a respective intermediate level; and maintaining the voltage of the adjacent word line at its respective intermediate level during the decreasing of the voltage of the selected word line. The sensing of the memory cells connected to the selected word line comprises: increasing the voltage of the adjacent word line from its respective intermediate level to a respective peak level; and sensing the memory cells connected to the selected word line while the voltage of the adjacent word line is at its respective peak level and the voltage of the selected word line is at a control gate read level.

The reduced level may be equal to the control gate read level.

Further, the discharging of the channels of the NAND strings comprises: increasing a voltage of a non-adjacent word line (WL0-WLn−2, WLn+2-WL95) of the selected word line from a respective initial level (e.g., 0 V) to a respective peak level (Vread); and maintaining the voltage of the non-adjacent word line at its respective peak level during the decreasing of the voltage of the selected word line. The sensing of the memory cells connected to the selected word line comprises maintaining the voltage of the non-adjacent word line at its respective peak level.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a plurality of memory cells arranged in NAND strings;
   a set of word lines connected to the plurality of memory cells; and
   a control circuit configured to, in response to a read command involving memory cells connected to a selected word line of the set of word lines, discharge channels of the NAND strings and, after the discharge of the channels, sense the memory cells connected to the selected word line; wherein:
      to discharge the channels, the control circuit is configured to increase a voltage of the selected word line from a respective initial level to a respective peak level and then decrease the voltage of the selected word line, the decrease is from the respective peak level to a reduced level, and increase a voltage of a drain-side adjacent word line of the selected word line from a respective initial level to a respective intermediate level and maintain the voltage of the drain-side adjacent word line at its respective intermediate level during the decrease of the voltage of the selected word line; and
      to sense the memory cells connected to the selected word line, the control circuit is configured to increase the voltage of the drain-side adjacent word line from its respective intermediate level to a respective peak level, and sense the memory cells connected to the selected word line while the voltage of the drain-side adjacent word line is at its respective peak level and the voltage of the selected word line is at a control gate read level.

2. The apparatus of claim 1, wherein:
   the reduced level is equal to the control gate read level.

3. The apparatus of claim 2, wherein:
   the control gate read level is based on a type of page which is read from the selected word line.

4. The apparatus of claim 1, wherein:
   the reduced level is below the control gate read level and to sense the memory cells connected to the selected word line, the control circuit is configured to increase the voltage of the selected word line from the reduced level to the control gate read level.

5. The apparatus of claim 1, wherein:
   to discharge the channels, the control circuit is configured to increase a voltage of a source-side adjacent word line of the selected word line from a respective initial level to a respective intermediate level and maintain the voltage of the source-side adjacent word line at its respective intermediate level during the decrease of the voltage of the selected word line; and
   to sense the memory cells connected to the selected word line, the control circuit is configured to increase the voltage of the source-side adjacent word line from its respective intermediate level to a respective peak level, and sense the memory cells connected to the selected word line while the voltage of the source-side adjacent word line is at its respective peak level.

6. The apparatus of claim 1, wherein:
   to discharge the channels, the control circuit is configured to increase a voltage of a word line which is adjacent to the drain-side adjacent word line from a respective initial level to a respective intermediate level which is greater than the respective intermediate level of the drain-side adjacent word line, and maintain the voltage of the word line which is adjacent to the drain-side adjacent word line at its respective intermediate level during the decrease of the voltage of the selected word line.

7. The apparatus of claim 1, further comprising:
   a temperature-sensing circuit, wherein the control circuit is configured to set the respective intermediate level of the drain-side adjacent word line at a lower level when a temperature provided by the temperature-sensing circuit is below a threshold than when the temperature is above the threshold.

8. The apparatus of claim 1, further comprising:
   a read cycle-tracking circuit, wherein the control circuit is configured to set the respective intermediate level of the drain-side adjacent word line at a lower level when number of read cycles provided by the read cycle-tracking circuit is below a threshold than when the number of read cycles is above the threshold.

9. The apparatus of claim 1, further comprising:
   a timer configured to track a time period since a last sensing operation of the NAND strings, wherein the control circuit is configured to set the respective intermediate level of the drain-side adjacent word line to be relatively lower when the time period is relatively longer.

10. The apparatus of claim 1, wherein:
    the control circuit is configured to set the respective intermediate level of the drain-side adjacent word line as a function of a position of the selected word line in the set of word lines.

11. The apparatus of claim 1, wherein:
    the respective intermediate level of the drain-side adjacent word line a higher than a threshold voltage of a highest data state stored by the plurality of memory cells.

12. The apparatus of claim 1, wherein:
    the NAND strings extend vertically in a stack;
    the stack comprises a lower tier and an upper tier; and
    the respective intermediate level of the drain-side adjacent word line is lower when the selected word line is halfway between a top and a bottom of the lower tier then when the selected word line is at the bottom of the lower tier.

13. The apparatus of claim 12, wherein:
    to discharge the channels when the selected word line is in the upper tier, the control circuit is configured to increase a voltage of a source-side adjacent word line of the selected word line from a respective initial level to a respective intermediate level and to maintain the voltage of the source-side adjacent word line at its respective intermediate level during the decrease of the voltage of the selected word line, wherein the voltage of the source-side adjacent word line is increased from the respective intermediate level to a respective peak level to sense the memory cells connected to the selected word line; and
    to discharge the channels when the selected word line is in the lower tier, the control circuit is configured to increase the voltage of the source-side adjacent word line from its respective initial level to its respective peak level and to maintain the voltage of the source-side adjacent word line at its respective peak level during the decrease of the voltage of the selected word line and during the sensing of the memory cells connected to the selected word line.

14. A method, comprising:
in response to a read command involving a selected word line connected to a set of NAND strings, discharging channels of the NAND strings then sensing memory cells connected to the selected word line, the discharging of the channels of the NAND strings comprises:
increasing a voltage of the selected word line from a respective initial level to a respective peak level;
decreasing the voltage of the selected word line from the respective peak level to a reduced level;
increasing a voltage of an adjacent word line of the selected word line from a respective initial level to a respective intermediate level; and
maintaining the voltage of the adjacent word line at its respective intermediate level during the decreasing of the voltage of the selected word line; and
the sensing of the memory cells connected to the selected word line comprises:
increasing the voltage of the adjacent word line from its respective intermediate level to a respective peak level; and
sensing the memory cells connected to the selected word line while the voltage of the adjacent word line is at its respective peak level and the voltage of the selected word line is at a control gate read level.

15. The method of claim 14, wherein:
the reduced level is equal to the control gate read level.

16. The method of claim 14, wherein:
the discharging of the channels of the NAND strings comprises increasing a voltage of a non-adjacent word line of the selected word line from a respective initial level to a respective peak level, and maintaining the voltage of the non-adjacent word line at its respective peak level during the decreasing of the voltage of the selected word line; and
the sensing of the memory cells connected to the selected word line comprises maintaining the voltage of the non-adjacent word line at its respective peak level.

17. An apparatus, comprising:
a set of NAND strings extending vertically in a stack, the NAND strings comprise memory cells, the stack comprises a lower tier, an interface above the lower tier, an upper tier above the interface, and alternating word line layers and dielectric layers in the lower tier and the upper tier; and
a control circuit, the control circuit, to perform a read operation for a selected word line layer of the stack, is configured to:
increase and then decrease a voltage of the selected word line layer to discharge channels of the NAND strings, before setting the voltage of the selected word line layer at a control gate read level;
sense memory cells connected to the selected word line layer while the voltage of the selected word line layer is set at the control gate read level; and
provide a voltage of a source-side adjacent word line layer of the selected word line layer at a read pass level during the sensing of the memory cells connected to the selected word line layer, wherein, during the decrease of the voltage of the selected word line layer, the control circuit is configured to provide the voltage of the source-side adjacent word line layer at a read pass level when the selected word line layer is in the lower tier and at an intermediate level which is below the read pass level and above 0 V when the selected word line layer is in the upper tier.

18. The apparatus of claim 17, wherein:
during the decrease of the voltage of the selected word line layer, the control circuit is configured to provide a voltage of a drain-side adjacent word line layer of the selected word line layer at a first intermediate level which is below the read pass level and above 0 V when the selected word line layer is in the lower tier and at a second intermediate level which is below the read pass level and above the first intermediate level when the selected word line layer is in the upper tier.

19. The apparatus of claim 18, wherein:
the control circuit is configured to provide the voltage of the drain-side adjacent word line layer at the read pass level during the sensing of the memory cells connected to the selected word line layer.

20. The apparatus of claim 19, wherein:
the control circuit is configured to set the second intermediate level to a lower level when the selected word line layer is halfway between a top and a bottom of the lower tier than when the selected word line layer is at a bottom of the lower tier.

* * * * *